US011243079B2

(12) United States Patent
Das

(10) Patent No.: US 11,243,079 B2
(45) Date of Patent: Feb. 8, 2022

(54) ROTATION SENSING AND MAGNETOMETRY USING LOCALIZATION ON A RING SHAPED LATTICE

(71) Applicant: KUTZTOWN UNIVERSITY OF PENNSYLVANIA, Kutztown, PA (US)

(72) Inventor: Kunal Das, Reading, PA (US)

(73) Assignee: Kutztown University of Pennsylvania, Kutztown, PA (US)

( * ) Notice: Subject to any disclaimer, the term of this patent is extended or adjusted under 35 U.S.C. 154(b) by 0 days.

(21) Appl. No.: 16/617,894

(22) PCT Filed: Nov. 12, 2019

(86) PCT No.: PCT/US2019/060903
§ 371 (c)(1),
(2) Date: Nov. 27, 2019

(87) PCT Pub. No.: WO2020/142140
PCT Pub. Date: Jul. 9, 2020

(65) Prior Publication Data
US 2021/0325185 A1 Oct. 21, 2021

Related U.S. Application Data

(60) Provisional application No. 62/787,502, filed on Jan. 2, 2019.

(51) Int. Cl.
*G01C 19/58* (2006.01)
*G01R 33/032* (2006.01)

(52) U.S. Cl.
CPC ........... *G01C 19/58* (2013.01); *G01R 33/032* (2013.01)

(58) Field of Classification Search
USPC ...................................... 73/504.05
See application file for complete search history.

(56) References Cited

U.S. PATENT DOCUMENTS 3,761,721 A 9/1973 Altshuler et al.
4,874,942 A 10/1989 Clauser
(Continued)

FOREIGN PATENT DOCUMENTS

CN 104613953 A 5/2015
CN 105066981 A 11/2015

OTHER PUBLICATIONS

Mazilu; et.al., "Simultaneous determination of the constituent azimuthal and radial mode indices for light fields possessing orbital angular momentum", Applied Physics Letters 100, (2012), pp. 231115-1-231115-4. (Year: 2012).*
(Continued)

*Primary Examiner* — Phillip A Johnston
(74) *Attorney, Agent, or Firm* — Buchanan Ingersoll & Rooney PC

(57) ABSTRACT

Embodiments relate to a sensor system configured to detect physical rotation, entire or relative, of one or more objects and/or their environment and/or proximity of a magnetic field, by measuring the degree of localization of a medium trapped in a ring-shaped artificial lattice. The lattice structure can be configured to comprise of lattice sites distributed with a lattice period around an azimuth of a closed ring. The site depths of the plurality of lattice sites can be configured to be modulated with a modulation period different from the lattice period to affect the onsite energies of each lattice site and the eigenstates of the system. Physical rotation of the sensor and/or the proximity of magnetic field will alter the localization properties so as to cause the degree of localization of the medium to change (e.g., the medium becomes more confined in space or more spread out in space).

21 Claims, 21 Drawing Sheets

(56) References Cited

U.S. PATENT DOCUMENTS

| | | | |
|---|---|---|---|
| 4,992,656 A | | 2/1991 | Clauser |
| 5,282,067 A | * | 1/1994 | Liu .................. G06K 9/74 |
| | | | 359/29 |
| 5,552,887 A | | 9/1996 | Dyott |
| 5,854,450 A | * | 12/1998 | Kent .................. G06F 3/0436 |
| | | | 178/18.04 |
| 9,030,655 B2 | | 5/2015 | Strabley |
| 10,452,029 B2 | * | 10/2019 | Katori .................. H03L 7/26 |
| 2006/0103380 A1 | | 5/2006 | Kochergin et al. |
| 2007/0241747 A1 | | 10/2007 | Morley et al. |
| 2015/0128696 A1 | | 5/2015 | Foreman et al. |
| 2017/0001670 A1 | | 1/2017 | Gruneklee |

OTHER PUBLICATIONS

Ricardez-Vargas; et al., "Experimental generation and dynamical reconfiguration of different circular optical lattices for applications in atom trapping", J. Opt. Soc. Am. B/ vol. 27, No. 5/May 2010, pp. 948-955. (Year: 2010).*

Neff; et al., "Two-Dimensional Spatial Light Modulators: A Tutorial", Proceedings of the IEEE, vol. 78, No. 5, May 1990, pp. 826-855. (Year: 1990).*

Bloch, "Ultracold quantum gases in optical lattices", Nature Physics | vol. 1 | Oct. 1, 2005, pp. 23-30. (Year: 2005).*

Amico, L., et al., Superfluid qubit systems with ring shaped optical lattices, Scientific Reports, 2014,pp. 1-7, 4: 4298.

Ying, G., et al., Eigenmodal analysis of Anderson localization: Applications to photonic lattices and Bose-Einstein condensates; Physica B, 2016, 87-96, 499, Elsevier.

Fischer, R. et al., Observation of light localization in modulated Bessel optical lattices, Optics Express, 2006, 1-6, vol. 14, No. 7, Optical Society of America.

Dong, J. et al.; Localization characteristics of two-dimensional quasicrystals consisting of metal nanoparticles, Physical Review, 2009,155118-1-155118-9, 80, The American Physical Society.

Haine, Simon A., Mean-Field Dynamics and Fisher Information in Matter Wave Interferometry, Physical Review Letters, 2016, 230404-1-230404-5, 116, American Physical Society.

International Search Report and The Written Opinion for PCT/US2019/060903, filed Nov. 12, 2019, dated Apr. 23, 2020.

* cited by examiner

ROTATION SENSING AND MAGNETOMETRY USING LOCALIZATION ON A RING SHAPED LATTICE

CROSS-REFERENCE TO RELATED APPLICATIONS

This patent application is the U.S. national stage application under 35 U.S.C. § 371 for International Patent Application No. PCT/US2019/060903, filed on Nov. 12, 2019, which is related to and claims the benefit of U.S. Provisional Patent Application 62/787,502 filed on Jan. 2, 2019, the entire contents of each being incorporated herein by reference.

STATEMENT REGARDING FEDERALLY SPONSORED RESEARCH OR DEVELOPMENT

This invention was made with government support under Grant No. 1707878 awarded by the National Science Foundation. The Government has certain rights in the invention.

FIELD OF THE INVENTION

Embodiments can relate to a sensor system that can be configured to detect rotation of an object and/or proximity of a magnetic field to an object by measuring localization distortion of media trapped in a ring-shaped artificial lattice.

BACKGROUND OF THE INVENTION

Conventional sensing techniques or methods using artificial lattices for measurements can be appreciated from U.S. Pat. Nos. 3,761,721; 4,992,656; 4,874,942; 5,552,887; 9,030,655; U.S. Pat. Publ. No. 2006/0103380; U.S. Pat. Publ. No. 2007/0241747; U.S. Pat. Publ. No. 2017/0016710; Observation of light localization in modulated Bessel optical lattices by Fischer et al., Optical Society of America, 2006; Eigenmodal Analysis of Anderson Localization by Ying et al., Feb. 13, 2014, available at http://www.journals.elsevier.com/physica-b-condensed-matter/; Localization characteristics of two-dimensional quasicrystals consisting of metal nanoparticles by Rong et al., available at https://arxiv.org/vc/arxiv/papers/0902/902.4772v1.pdf; and Mean-Field Dynamics and Fisher Information in Matter Wave Interferometry by Haine, Jun. 16, 2016 available at https://journals.aps.org/prl/abstract/10.1103/PhysRevLett.116.230404.

Precision rotation sensing has continued to rely upon interferometry techniques and likewise high precision sensing of magnetic fields use interference effects in the embodiments of SQUID (superconducting quantum interference device). The sensor systems and the maximum sensitivity and precision attainable in both arenas are therefore subject to limitations of interferometry. This invention relates to embodiments based upon a different principle that does not require use of interferometry and yet can be capable of achieving comparable or better sensitivity or precision of conventional interferometry based methods and possibly on shorter time scales.

SUMMARY OF THE INVENTION

Embodiments can relate to a sensor system that can be configured to measure physical rotation, entire or relative, of one or more objects and/or their environment, and/or proximity of a magnetic field, with a high degree of sensitivity. The sensor can be configured to use a ring-shaped arrangement of lattice sites distributed according to a lattice period to generate an artificial lattice structure for confining a medium (e.g., atoms, molecules, ions, photons etc.). The well depths of the individual lattice sites of the lattice structure can be configured to be modulated via periodic modulation (e.g., sinusoidal modulation) with a modulation period that can differ from the lattice period, to affect the onsite energies of each lattice site and the eigenstates of the medium in lattice structure. Physical rotation of the sensor or the proximity of magnetic field will alter the degree of localization (e.g., the medium becomes more confined in space or more spread out in space). The degree of localization can be determined via derived equations that take into account relevant variables such as onsite energy at each lattice site and the strength of interaction between lattice sites.

The degree of localization can be measured and it is highly sensitive to rotation, entire or relative, of an object and/or proximity of a magnetic field. One of the benefits of the inventive system is the ability to obviate the use of interferometry, as is otherwise used in conventional precision rotation sensing systems. It should be noted that other forms of rotation sensor systems (ones that do not use interferometry), such as mechanical gyroscopes for example, cannot provide the level of precision that embodiments of the disclosed system and methods can achieve.

In one embodiment, a sensor system can include an artificial lattice structure configured to confine a medium to a plurality of lattice sites arranged in the shape of a closed ring, the artificial lattice structure having a lattice period that defines a distance between adjacent lattice sites, wherein each lattice site is defined as a potential well having a site depth. The sensor system can include a modulation mechanism for varying the site depth of any one or combination of lattice sites of the plurality of lattice sites, in accordance with a modulation period, the modulation period being different from the lattice period, and a magnitude of the modulation defined by a modulation amplitude. The medium can have a property of being able to migrate among the plurality of lattice sites, with a propensity of migration defined by a coupling strength between adjacent lattice sites. The sensor system can be configured to generate an output that is a function of the distribution of the medium in the artificial lattice structure.

In some embodiments, the sensor system includes an artificial lattice structure generating apparatus configured to generate the artificial lattice by continuous variation of an energy field or a structure to which the medium is sensitive so as to create a plurality of local minima where the medium congregates, wherein each of the local minimum defines a location of a lattice site.

In some embodiments, the lattice period and the modulation period are commensurate with each other such that the complete circumference of the closed ring accommodates an exact positive integer multiple of the lattice period and an exact positive integer multiple of the modulation period.

In some embodiments, the modulation mechanism is configured to modulate any one or combination of the site depth and the coupling strength.

In some embodiments, the artificial lattice includes: a coherent light source configured to generate photons as the medium; and a plurality of waveguides configured to propagate the photons. Each waveguide is set as a lattice site arranged in the closed ring-shape. The modulation mechanism includes an apparatus for tuning a refractive index and/or the coupling strength of each waveguide.

In some embodiments, the artificial lattice includes a modulated ring-shaped interference pattern of light comprising a first set of light beams and a second set of light beams. A pair of primary laser light sources generates the first set of light beams comprising a first primary light beam and a second primary light beam, each of the first primary light beam and the second primary light beam having internal orbital angular momentum, wherein the first primary light beam is characterized by an azimuthal mode index that differs from an azimuthal mode index of the second primary light beam such that the interference of the first primary light beam and the second primary light beam creates a ring-shaped interference pattern of alternating dark and bright intensities to generate the plurality of lattice sites. A pair of secondary laser light sources generates the second set of light beams comprising a first secondary light beam and a second secondary light beam, each of the first secondary light beam and the second secondary light beam having internal orbital angular momentum, wherein the first secondary light beam is characterized by an azimuthal mode index that differs from an azimuthal mode index of the second secondary light beam such that the interference of the first secondary light beam and the second secondary light beam creates a ring-shaped interference pattern of alternating dark and bright intensities, wherein the azimuthal mode indices of the second set of light beams differs from the azimuthal mode indices of the first set of light beams so that the ring-shaped interference pattern formed by the second set of light beams occurs at a periodicity that differs from a periodicity of the ring-shaped interference pattern formed by the first set of light beams. The modulation mechanism is configured to cause the ring-shaped interference pattern formed by the second set of light beams to overlap with the ring-shaped interference pattern formed by the first set of light beams to generate the modulated ring-shaped interference pattern. The medium is confined within the modulated ring-shaped interference pattern. The modulation mechanism includes an apparatus for adjusting power of each of the primary laser light sources and the secondary laser light sources to tune the coupling strength and the modulation amplitude.

In some embodiments, the sensor system includes an additional light source configured to generate a light-sheet to further confine the medium.

In some embodiments, the sensor system includes an apparatus for generating the atoms or molecules as the medium, the apparatus configured to place the atoms or the molecules in an ultracold state to generate ultracold atoms or molecules as the medium, wherein the atoms or the molecules display quantum mechanical features of coherent matter waves.

In some embodiments, the sensor system includes an apparatus for adjusting the azimuthal mode indices and the internal orbital angular momenta of the first set of light beams and the second set of light beams to adjust and control the lattice period and the modulation period.

In some embodiments, the artificial lattice includes a substrate having a first material and a plurality of second material formations within the first material, the first material having an energy bandgap that is wider than an energy bandgap of the second material, the second material formations being configured to confine the medium. The plurality of second material formations is arranged in the closed ring-shape. The substrate is configured as a transistor having a source terminal, a drain terminal, and a gate terminal. The modulation mechanism includes an apparatus for adjusting voltage applied to the transistor.

In some embodiments, the modulation mechanism is configured to vary the energy bandgaps of the plurality of the second material formations.

In some embodiments, the modulation mechanism is configured to vary the physical dimension of the plurality of the second material formations.

In some embodiments, the sensor system includes a detection unit configured to receive the output.

In some embodiments, the sensor system includes the medium is any one or combination of: photons; ultracold atoms or molecules; and particles that carry electric charge.

In some embodiments, the medium interacts with itself and the effects of such interaction is utilized to attain better sensitivity.

In one embodiment, a method for sensing rotation can involve adjusting the modulation mechanism of an embodiment of the sensor system disclosed herein so that a ratio of the coupling strength to the modulation amplitude causes the medium to have a tendency to delocalize or have a tendency to localize in the absence of rotation. The method can involve introducing the medium so as to be distributed among the plurality of lattice sites according to a predetermined distribution function. The method can involve allowing the medium to exist or evolve in the sensor system for a predetermined period of time. The method can involve measuring distribution of the medium among the plurality of lattice sites and quantifying the degree of localization of the medium. The method can involve detecting rotation by determining a magnitude of angular velocity via a calibration of degree of localization to the magnitude of rotation and/or rate of rotation.

In some embodiments, detecting rotation involves measuring extrinsic rotation; the modulation mechanism is adjusted so that the ratio of the coupling strength to the modulation amplitude causes the medium to have a tendency to delocalize in the absence of any rotation; and the presence of rotation causes partial localization in proportion to a rate of rotation.

In some embodiments, detecting rotation involves detecting relative rotation of a first component and a second component. The first component includes the artificial lattice structure and a first object attached thereto. The second component includes the modulation mechanism and a second object attached thereto. The modulation mechanism is adjusted so that the ratio of the coupling strength to the modulation amplitude causes the medium to have a tendency to localize in the absence of any rotation. The presence of rotation causes partial delocalization in proportion to a rotation.

In one embodiment, a method for sensing magnetic fields and/or magnetic potentials can involve adjusting the modulation mechanism of an embodiment of the sensor system disclosed herein so that a ratio of the coupling strength to the modulation amplitude causes the medium to have a tendency to delocalize; introducing the medium, the medium carrying electric charge, so as to be distributed among the plurality of lattice sites according to a predetermined distribution function. The method can involve allowing the medium to exist or evolve in the sensor system for a predetermined period of time. The method can involve measuring the distribution of the medium among the plurality of lattice sites and quantifying the degree of localization of the medium. The method can involve detecting presence of a magnetic field and/or a magnetic potential by calibration of the degree of localization to the magnitude of magnetic field and/or the magnitude of the magnetic potential.

In some embodiments, a direction of rotation, as in left handed or right handed, clockwise or anticlockwise, or an orientation of the magnetic field is determined by calibrating or preparing the system such that the degree of localization increases in the presence of rotation that is in a first direction but decreases when in the presence of the rotation that is in a second direction, or the degree of localization increases in the presence of magnetic field or potential that is in a first orientation but decreases when in the presence of a magnetic field or potential that is in a second the orientation.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present innovation will be more apparent from the following more particular description thereof, presented in conjunction with the following drawings. Like reference numbers used in the drawings may identify like components.

DETAILED DESCRIPTION OF THE INVENTION

The following description is of exemplary embodiments that are presently contemplated for carrying out the present invention. This description is not to be taken in a limiting sense, but is made merely for the purpose of describing the general principles and features of the present invention. The scope of the present invention is not limited by this description.

Figure 1:
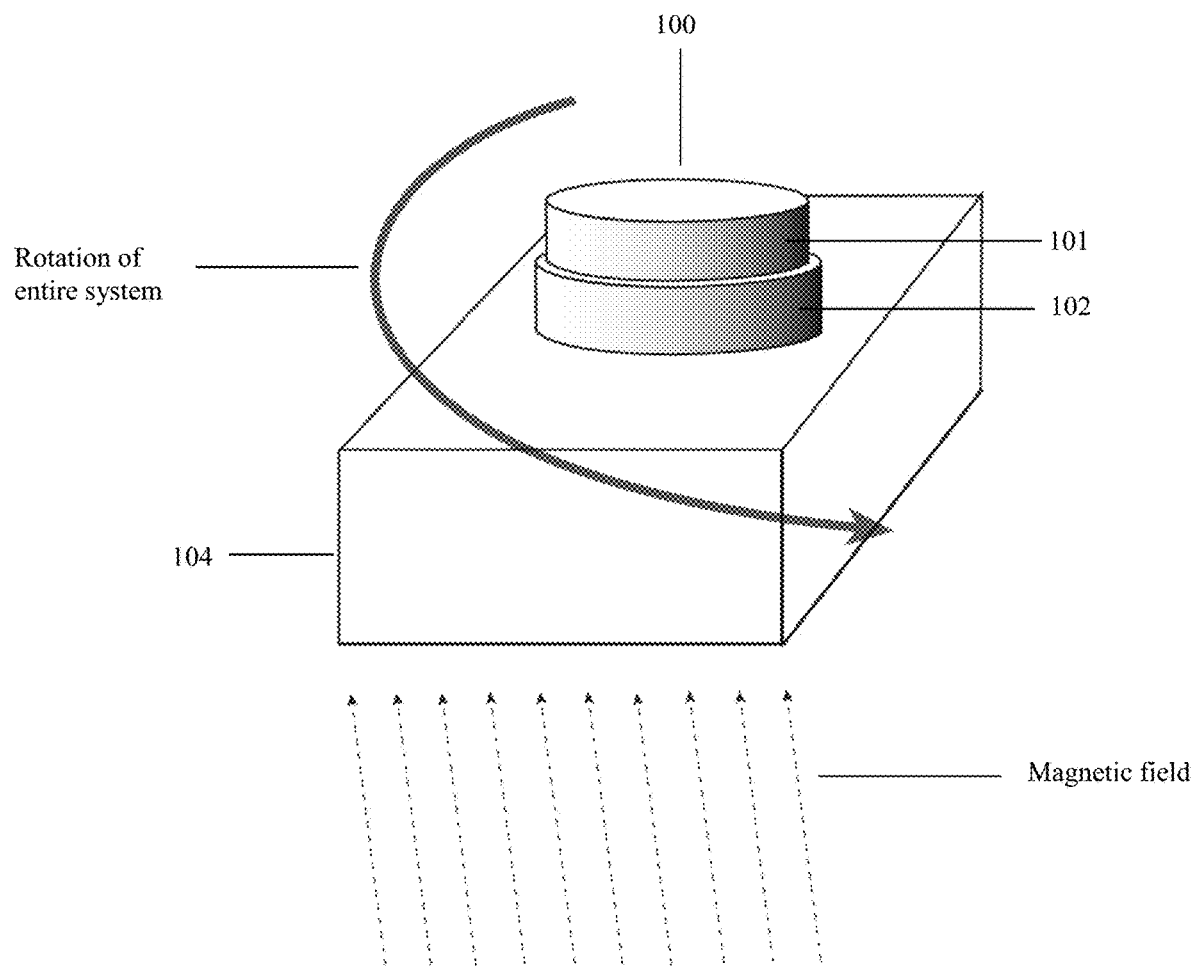
FIG. 1 is an illustration of extrinsic operation wherein the sensor system is applied to an object to measure physical rotation of the entire object and/or its proximity to a magnetic field.
Figure 2:
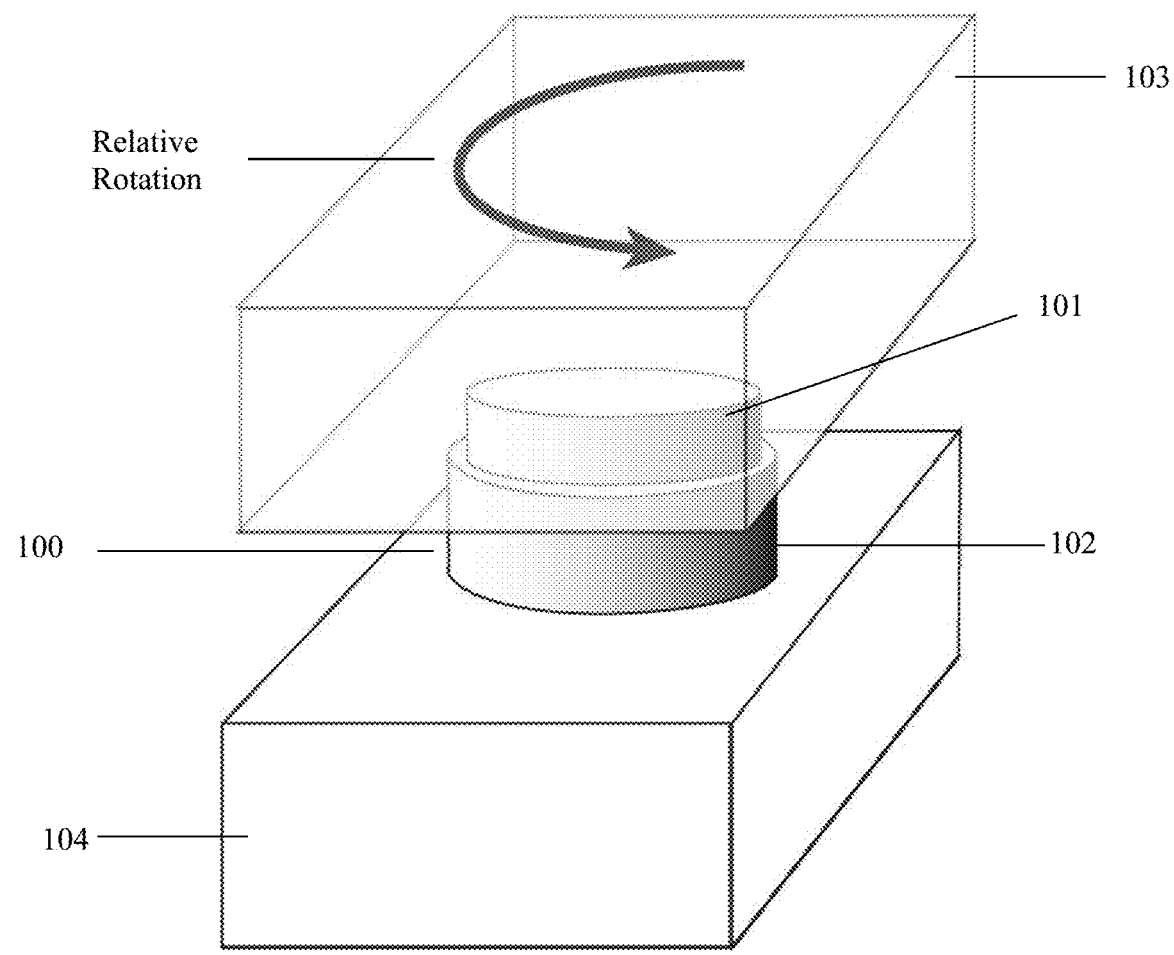
FIG. 2 is an illustration of the sensor system being applied to two separate objects or separately movable parts of a single object to measure their relative rotation.
Figure 3:
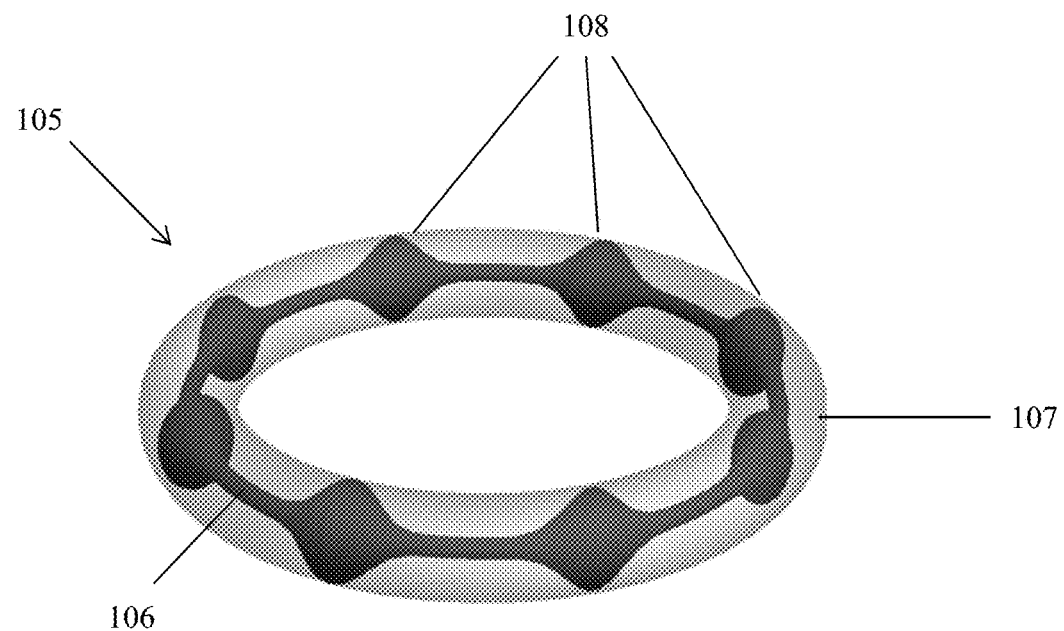
FIG. 3 shows an exemplary artificial lattice structure than can be used with an embodiment of the sensor system. In the first instance, the medium is shown contained by a confining potential represented as a torus, and the presence of the lattice is evident in the preferential clumping of the medium at specific lattice sites. In the second instance, a more schematic illustration represents the lattice as marked locations around a circle with the medium depicted as an undulating curve of height proportional to the local density of the medium.
Figure 3:
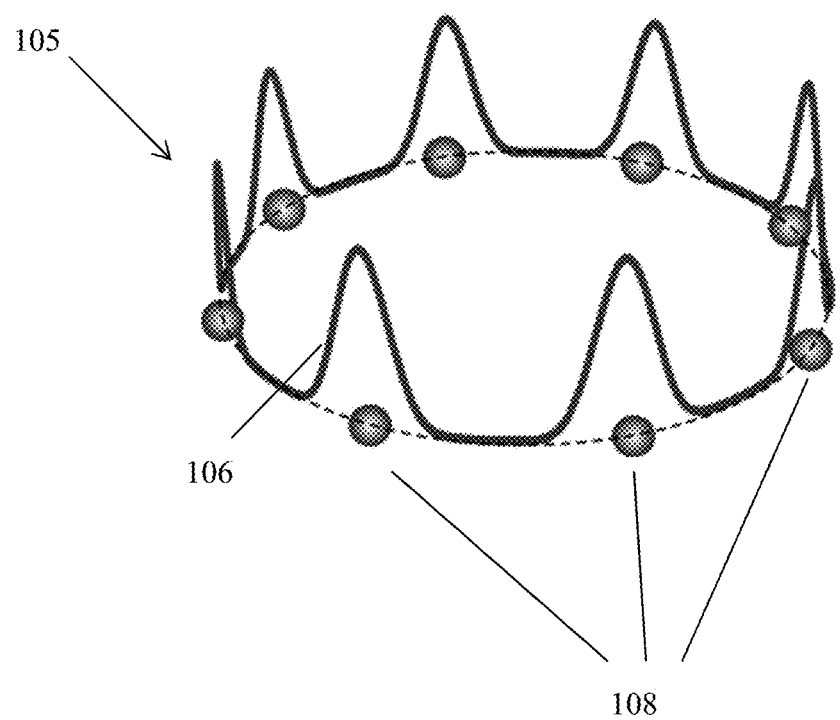
Figure 4:
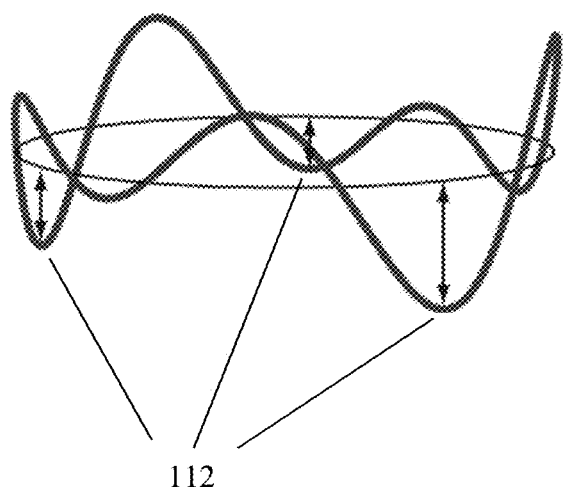
FIG. 4 shows an exemplary periodic potential energy formation that can be used to generate lattice sites of an embodiment of the artificial lattice structure, with modulated site depths illustrated.

Referring to FIGS. 1-2, embodiments relate to a sensor system 100 that can be configured to detect entire rotation (meaning rotation as a whole) of the environment it is housed in or of a specific object 104 that it is attached to and measure the rate of that rotation; and alternately can be configured to detect and measure the relative rotation of two separate objects 103 and 104 which could alternately be sub-parts of the same system or object, with the recited object 103 attached to subpart 101 of the sensor system 100 and the recited object 104 attached to subpart 102 of the sensor system 100, wherein subparts 101 and 102 can be configured to be able to rotate and move independently of each other; and alternately can be configured to detect the presence or proximity of a magnetic field to the recited environment or an object 104 and measure the strength of that magnetic field; with the detection and the measurement in all listed functionalities, being achievable at a high degree of sensitivity.

The system 100 can include an artificial lattice structure 105 configured to confine a medium 106 at predetermined lattice sites 108. The system 100 can be configured to comprise of additional structures 107 to provide necessary confinement or containment for the medium 106 in different directions and orientations. The artificial lattice structure 105 can be formed by manipulating a relevant energy field or physical structure, or combinations thereof, to which the medium 106 is sensitive, to generate local potential energy wells or minima (to be also referred to as potential wells) located at the predetermined lattice sites 108 wherein the medium 106 would have the affinity to congregate. For example, the artificial lattice structure 105 can include a plurality of waveguides 110 configured to propagate laser light (see FIG. 6). Each waveguide 110 can serve as a potential well and the photons propagating through the waveguides 110 constitute the medium 106. As another example, the artificial lattice structure 105 can be formed by the interference of laser beams having hollow intensity cross-sections and each carrying a different internal orbital angular momentum (OAM), creating a spatially periodic pattern of intensity variations resembling a lattice structure 105 in which the medium 106 can be trapped (see FIG. 7) congregating around the locations of the intensities that correspond to the minimal values of potential energy sensed by the medium 106, which in this embodiment can be ultracold atoms or molecules that can be sensitive to laser fields. Additional lasers can be used to produce the structures 107 to confine the medium 106 in directions transverse to the lattice structure 105. As another example, the artificial lattice structure 105 can include an array of quantum wells formed in a semi-conductor material (see FIG. 8). The media 106 in this embodiment can be charged particles, such as carriers like electrons and holes or alternately ions.

The artificial lattice structure 105 can be configured to have a closed ring-shaped arrangement, such that the potential wells, and hence the lattice sites 108 that constitute the artificial lattice structure 105, are arranged in an annular fashion (e.g., around the circumference of a flat circle). For instance, an artificial lattice structure 105 can have a first lattice site 108, a second lattice site 108, a third lattice site 108, and a fourth lattice site 108. The first lattice site 108 can be located at a 12 o'clock position, the second lattice site 108 can be located at a 3 o'clock position, the third lattice site 108 can be located at a 6 o'clock position, and the fourth lattice site 108 can be located at a 9 o'clock position. It will be understood with the benefit of the present disclosure, that any number of lattice sites 108 can be generated along the lattice structure 105. For instance, an artificial lattice structure 105 can have a first lattice site 108, a second lattice site 108, a third lattice site 108, and a fourth lattice site 108, a fifth lattice site 108, a sixth lattice site 108, a seventh lattice site 108, an eighth lattice site 108, etc. Each lattice site 108 can be positioned equidistant from adjacent lattice sites 108, so that the locations of the lattice sites 108 within the artificial lattice structure 105 have a set periodicity to them. The distance separating the centers of adjacent potential minima or lattice sites 108 will be referred to herein as the lattice period; in the case of a ring-shaped arrangement of the lattice sites, that distance can be as measured along the ring circumference.

The maximum depth of each potential well, as experienced by the medium 106, defined with respect to some chosen reference value, will be referred to herein as the site depth 112. Embodiments of the system 100 can be configured so that the site depths 112 can be modulated (see FIG. 9), such that the site depths 112 vary from one lattice site 108 to another lattice site 108 by becoming shallower or deeper. The modulation of the site depths 112 can occur with a well-defined periodicity that determines the minimum distance after which the modulation repeats itself, referred to herein as the modulation period. It is contemplated for the modulation period to be different from the lattice period as defined herein. Having the modulation period be different from the lattice period can facilitate modulation of the system 100 by causing a site depth 112 of at least one lattice site 108 to be changed by a measure that is different from that of another lattice site 108. For example, if the artificial lattice structure 105 has eight lattice sites 108 equally spaced apart around a closed ring-shaped arrangement, then it has a lattice period of C/8, with C representing the mean length around the ring. Modulating the site depths 112 can be done using a sinusoidal function with a periodicity set as to fit 5 complete periods over the same span C, for example. The value of the sinusoidal function at the center of the lattice site 108 serves as the measure of the degree to which the site depth 112 is made to vary from its unmodulated value. The modulation can be induced by a second modality of the same mechanism used to create the fundamental lattice structure 105 for each specific embodiment as described earlier, but with the understanding that other methods of creating the modulation are possible and covered herewith. As explained herein, the amplitude or strength of the modulation can be a controllable variable or parameter, and will be referred to herein as the modulation amplitude.

It is contemplated that lattice period and the modulation period can be commensurate with each other such that the complete spatial span of the lattice structure, which can be the length of the circumference of a closed ring, accommodates an exact positive integer multiple of the lattice period and an exact positive integer multiple of the modulation period, where the two positive integers as recited can be different.

It is contemplated for the medium 106 to have the ability to migrate between the lattice sites 108 to some limited degree that can be controlled and tuned as needed by varying the unmodulated depth 112 of the potential wells at the lattice sites 108 or the mean separation between adjacent lattice sites 108. The degree to which the medium 106 can migrate or tunnel between adjacent lattice sites 108 is quantified by a parameter that will herein be referred to as the nearest-neighbor coupling strength, or simply as the coupling strength.

It is contemplated for the medium 106 to display properties of waves, and specifically, possess the ability to display the wave property of coherence. For example, the medium 106 can be comprised of material particles in quantum-mechanical states that behave as matter waves described by the Schrödinger equation. Such particles may include, but are not limited to atoms, molecules, ions, subatomic particles like electrons or holes, quasi-particles, composite particles, etc. As another example, the medium 106 can be coherent light, such as produced by a laser, which can also be described as aggregates of massless particles called photons in a quantum mechanical picture.

Figure 5:
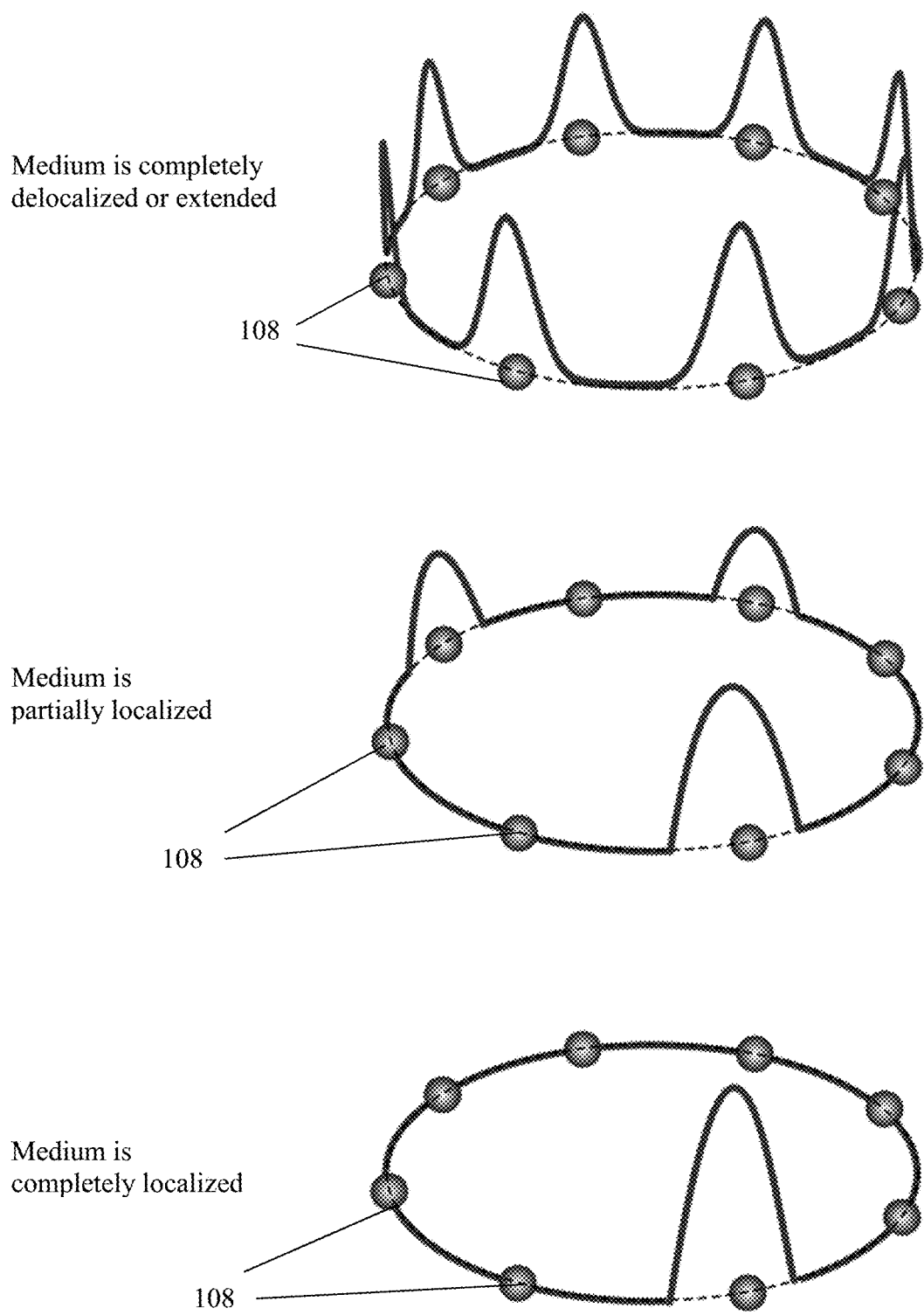
FIG. 5 shows an exemplary illustration of localization distortion of media trapped within an embodiment of the artificial lattice structure due to physical rotation and/or presence of a magnetic field. Cases of complete delocalization (extended), partial localization (which has the same meaning as partial delocalization), and complete localization are illustrated.

The degree of localization of the medium 106 is the primary observable, and in general terms, defined as the level of non-uniformity in the distribution of the medium 106 around the lattice 105, taking into account the proclivity of the medium 106 to congregate at the lattice sites 108. Two extreme cases will illustrate: If the medium 106 is distributed such that all lattice sites 108 contain equal fractions of the medium 106 then it would be considered completely delocalized (or extended); at the other extreme, if the totality of the medium 106 is congregated at one single lattice site 108, then it is completely localized. All other cases would be intermediate. FIG. 5 illustrates these two extreme cases along with an intermediate case of partial localization which is the same as partial delocalization.

The degree of localization can be determined from the measurement or detection of how the medium 106 is distributed among the different lattice sites 108. The degree of localization as defined above can be made highly sensitive to rotation, entire or relative, and in the case of a medium 106 that carries electric charge, also to the presence or the proximity of magnetic fields. For instance, the degree of localization can be calibrated to the rate of rotation or the amount of rotation or the strength of the magnetic field, such that a measurement of the degree of localization will yield a measurement of the strength of each of the listed characteristics.

Figure 6:
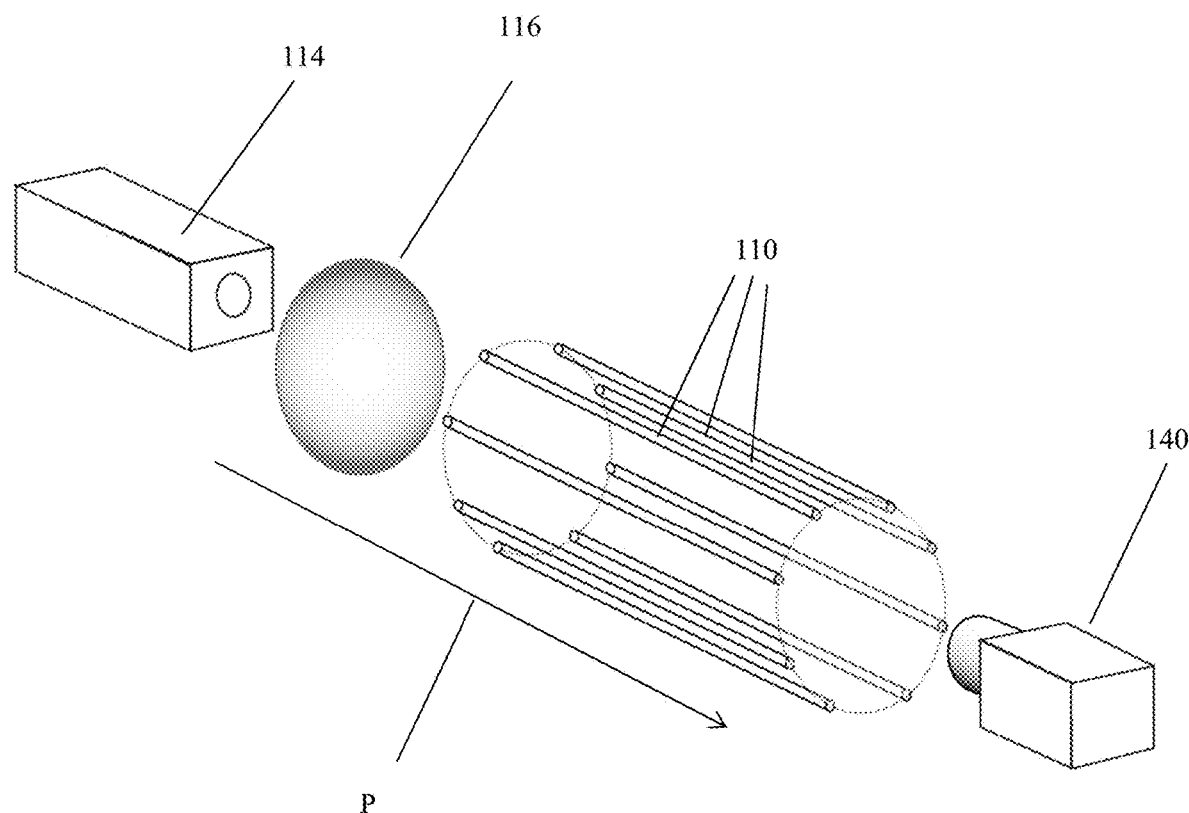
FIG. 6 shows an exemplary sensor system configuration using waveguides to generate a ring-shaped arrangement for an embodiment of the artificial lattice structure.

Referring to FIG. 6, in an exemplary, non-limiting embodiment, the sensor system 100 can include an artificial lattice structure 105 configured to confine a medium 106 at predetermined lattice sites 108. The artificial lattice structure 105 can include a plurality of waveguides 110, arranged in a circular array to form a ring-shaped arrangement and configured to propagate laser light along a path P. Each waveguide 110 can be considered a lattice site 108. A coherent light source 114 (e.g., a laser) can be coupled to the artificial lattice structure 105 via an optical coupler 116 (e.g., lens, collimator, etc. and combinations thereof). With this embodiment, the medium 106 (e.g., the photons or laser light) can be propagated along the artificial lattice structure 105 along a path P. Each waveguide 110 can be configured to have its refractive index tuned. This can be achieved via application of electric fields, use of thin films, use of adjustable air gaps between materials comprising the waveguides 110, etc. The tunable nature of the refractive indices can allow for modulation of the refractive indices of the waveguides 110 which serves as the modulation of the site depths 112. The plurality of waveguide 110 can be modulated via changes in refractive indices that occur with a modulation period that differs from the lattice period.

Figure 7:
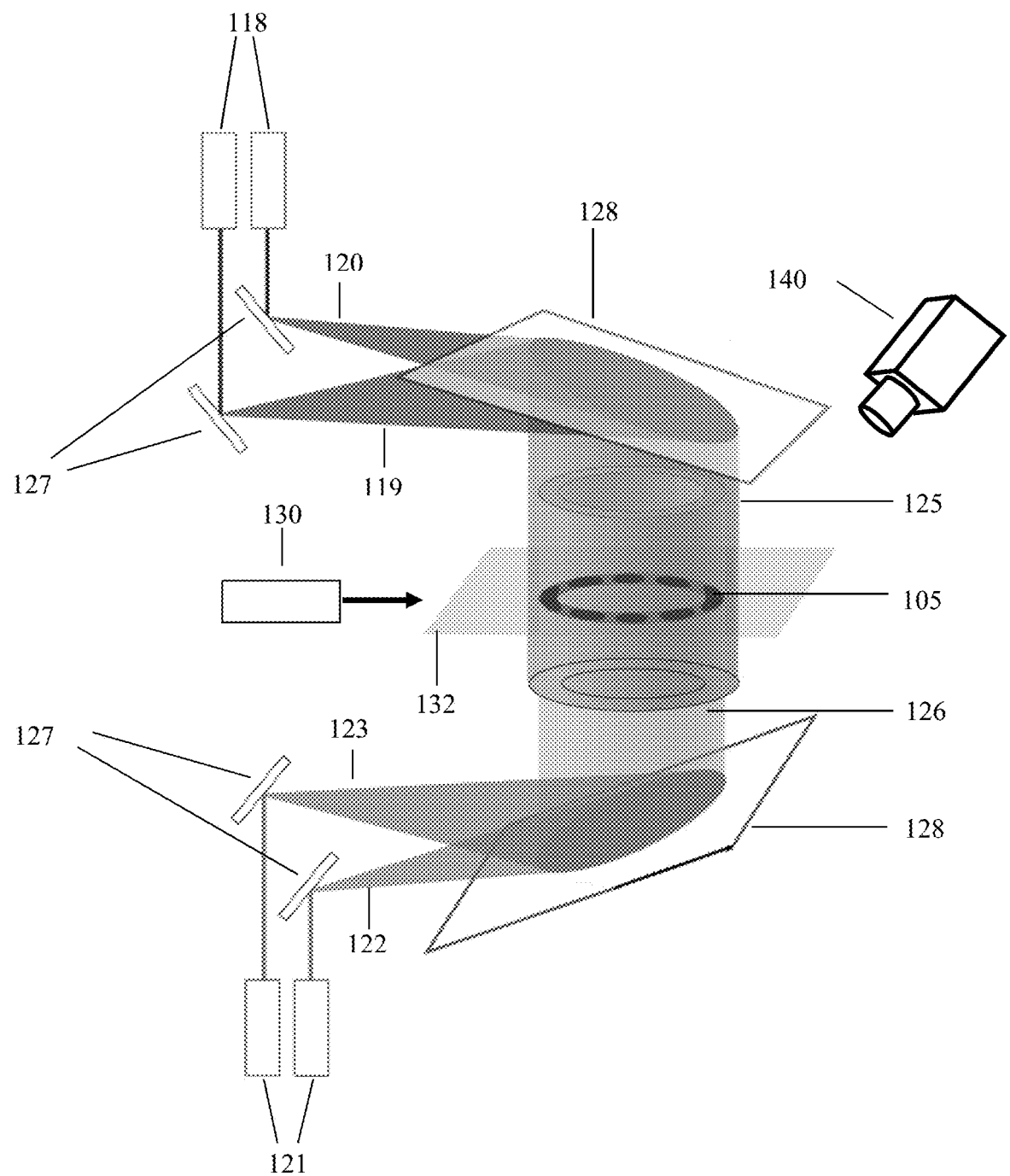
FIG. 7 shows an exemplary sensor system configuration using a pair of coaxially propagating laser beams with a hollow intensity cross-section, as in Laguerre-Gaussian beams, to generate a ring-shaped arrangement for an embodiment of the artificial lattice structure.

Referring to FIG. 7, in another exemplary, non-limiting example, the artificial lattice structure 105 can be formed with a pair of primary laser light sources 118. For instance, two laser beams (e.g., a first primary light beam and a second primary light beam) can be produced from the same laser using beam splitters, their outputs being converted by diffraction from forked gratings contemplated to be spatial light modulators (SLM) 127. The SLM 127 can produce holographic patterns so that the outputs are converted to a pair of beams 119 and 120. The pair of beams 119 and 120 can have azimuthal phase dependence, also called internal orbital angular momentum (OAM). For instance, the pair of beams 119 and 120 can be generated as Laguerre-Gaussian beams having hollow intensity cross-sections, with each beam characterized by a different azimuthal mode index, such that their interference creates a resultant beam 125. The resultant beam 125 can contain a ring-shaped pattern of alternating dark and bright intensities about its azimuth. Lattice sites 108 can be realized at a desired location by manipulating the beam 125 with optical elements (e.g., any one or combination of mirrors, beam splitters, etc.). For instance, the beam 125 can be reflected from a mirror 128. A pair of secondary laser light sources 121 in a setup similar to that recited for the pair of primary laser light sources 118, can be used to produce a pair of beams 122 and 123 (e.g., a first secondary light beam and a second secondary light beam) also carrying internal OAM but with a different combination of azimuthal mode indices. This can be done so that when the beams 122 and 123 are brought to interfere, a resultant beam 126 is generated that contains a pattern of alternating dark and bright intensities of a different periodicity than is produced by the primary laser light sources 118. Beam 126 can be manipulated by interaction with optical elements, such as by reflection from a mirror 128 so as to be made to overlap with the primary beam 125 at the desired location where lattice sites 108 are realized. This overlapping configuration can serve to modulate the lattice sites 108. Medium 106 can be cooled and congregated in the locations of potential minima of the lattice sites 108. The media 106 in this embodiment can be atoms or molecules. An additional light source 130 can be used to generate a light-sheet 132 that orthogonally transverses the light beams 125, 126. The light-sheet 132 can be generated by producing a laser beam that is focused only in one direction (e.g. using a cylindrical lens). The light-sheet 132 can be used to provide confinement to the medium in the direction of propagation of the beams 125, 126. The site depth 112 of the lattice sites 108 can be controlled via the intensities of light sources 118, and modulation amplitude can be controlled via the intensities of light sources 121. In addition, the lattice period and the modulation periods in this embodiment can be tuned by changing the combinations of the azimuthal mode indices in the beam pair 119, 120 and the beam pair 122, 123 respectively.

Figure 8:
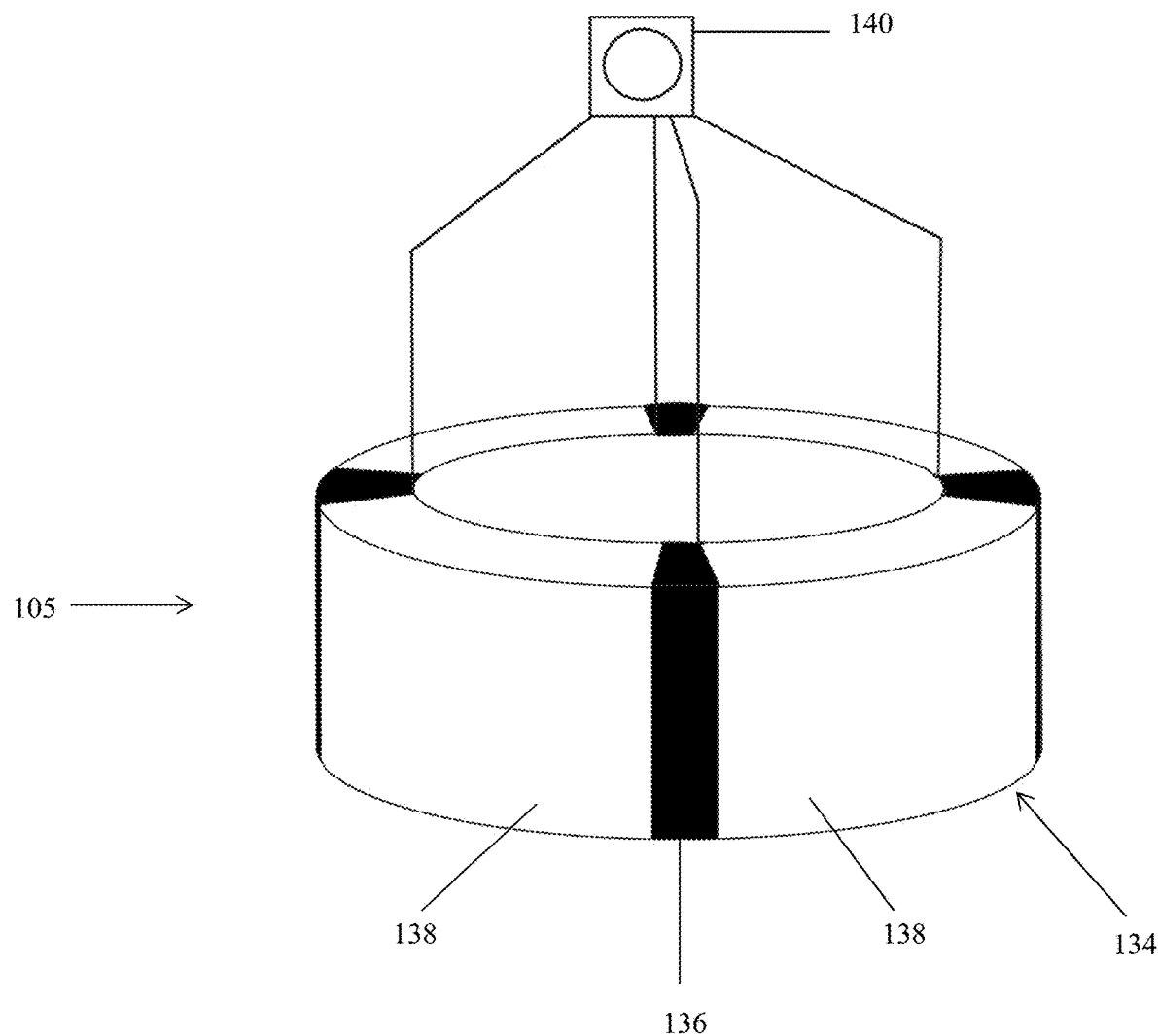
FIG. 8 shows an exemplary sensor system configuration using a semi-conductor substrate to generate a ring-shaped arrangement for an embodiment of the artificial lattice structure.

Referring to FIG. 8, in another exemplary, non-limiting example, the artificial lattice structure 105 can be formed as an array of quantum wells generated in a semi-conductor material 136. For example, a semi-conductor material 136 having a first energy bandgap can be formed between a material 138 having a second energy bandgap, wherein the second energy bandgap is wider than the first energy bandgap. The semi-conductor material 136 with the first energy bandgap can be the quantum well or the lattice site 108. For instance, the artificial lattice structure 105 can be a substrate 134 of material 138 having a plurality of semi-conductor material 136 formations positioned within the material 138. The plurality of semi-conductor material 136 formations can be in a ring-shaped arrangement. The media 106 in this embodiment can be charged particles. The substrate 134 can be configured as a transistor having a source terminal, a drain terminal, and a gate terminal. The transistor can be connected to an electrical power source. The site depths 112 can be tuned in by changing the gate voltage applied to the transistor.

In the embodiment recited above, modulation of site depths 112 can be achieved by applying different gate voltages to the different wells. Alternately, the modulation of site depths 112 can be achieved by varying the first bandgap in the different instances of the plurality of semiconductor material 136, for example by changing the level of doping. Alternately, the modulation of site depths can be achieved by varying the physical dimensions of the plurality of semiconductor material 136 to alter the value of the eigenenergies of the associated quantum wells.

Embodiments of the sensor system 100 can include a detection unit 140. The detection unit 140 can be configured to detect the degree of localization of the medium 106 (e.g., how much the medium becomes more confined in space or more spread out in space) due to rotation or presence of a magnetic field. The detection unit 140 can be configured to operate in a manner that is feasible with the type of artificial lattice structure 105 being used. For example, embodiments of the sensor system 100 in which the artificial lattice structure 105 is generated via a plurality of waveguides 110 can include a detection unit 140 configured to measure the distribution of light output from the artificial lattice structure 105. This can be done with a charge-coupled device (CCD) camera that detects the light output at the exit end of the waveguide array. The intensity of light detected from each waveguide determines the distribution of the medium among the lattice sites 108 in this embodiment. Embodiments of the sensor system 100 in which the artificial lattice structure 105 is generated via the interference of counter-propagating laser beams can include a detection unit 140 configured to capture images of the medium. This can be achieved by turning off all the confining potentials and releasing the medium 106 allowing it to expand ballistically and imaging the expanded medium 106 after a suitable time. Such imaging techniques can include, but are not limited to, absorptive imaging, fluorescence imaging, and dispersive imaging. The image can be directly correlated to the distribution of the medium 106 among the lattice sites before release. Embodiments of the sensor system 100 in which the artificial lattice structure 105 is generated via an array of quantum wells formed in a semi-conductor material 136 can include a detection unit 140 configured to measure current flow from the lattice sites 108. Possible of ways of sensing variation in localization of the charged particle can include monitoring variations in the flow of a current around the ring. Alternately, the outflow of current from each individual quantum well can be measured for the same purpose. Alternately, direct imaging of the distribution of the charged particles among the different lattice sites 108 can be measured for the same purpose.

The sensor system 100 can include a processor. The processor can be a hardware unit connected to a memory (e.g., a non-transitory computer readable medium). The memory can have a program and/or application stored thereon that can be run to have the processor perform an embodiment of the methods disclosed herein. The processor can be part of the detection unit 140. In the alternative, the detection unit 140 can be in communication (e.g. via a direct wired communication connection, a direct wireless communication connection, or a network communication connection) with the processor to facilitate transmission of data between the detection unit 140 and the processor. The processor can be configured to detect the degree of localization of the medium 106. Methods of doing so are described in more detail later.

Figure 9:
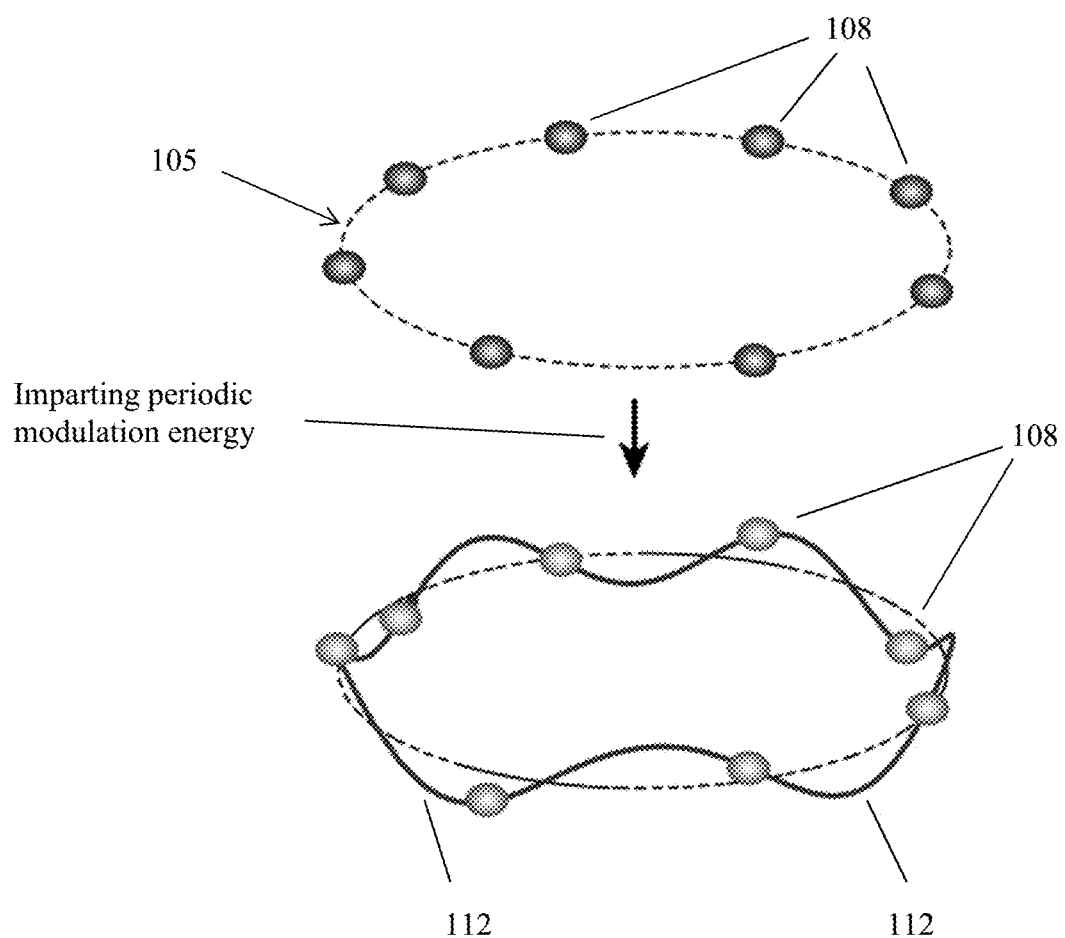
FIG. 9 illustrates the modulation of the onsite energies of the lattice sites, with the displacement of the lattice sites from the plane of a reference circle indicating the magnitude of the modulation, and a sinusoidal curve indicating that the modulation values are dictated by some periodic function with a periodicity that differs from that of the periodic spacing of the lattice sites.

The operation of the invention can be described quantitatively in the simplified context of a tight-binding approximation for a medium subject to a periodic lattice potential, with the understanding that each embodiment will generally require more involved quantitative analysis, but can be well described by this approximation in the limit of deep potential wells. The tight-binding approximation treats the lattice sites 108 as a set of discrete points labeled by site index n, with each lattice site assigned an onsite energy as defined herein, and with every lattice site interacting only with its nearest neighbors (as in immediately adjacent lattice sites, n−1 and n+1), the strength of that interaction being the coupling strength as defined herein. FIG. 9 shows an idealized discrete lattice model in the limit of the tight-binding approximation with lattice sites 108 confined to a ring-shaped lattice arrangement, with the modulation of the onsite energies depicted as vertical displacement of the lattice sites 108.

Within this tight-binding approximation, Equation (1) can be used to describe the behavior of the medium 106 distributed among discrete lattice sites 108, by determining the possible stationary solutions for $\Psi_n$, which represent the complete set of amplitudes of the medium 106 located at all lattice sites 108 in the lattice structure 105, labeled by values of the site index n, and in general $\Psi_n$ can comprise of complex-valued numbers or expressions.

$$V_1\Psi_{n+1}e^{-i\theta}+V_2\cos(2\pi n\alpha+\varphi)\Psi_n+V_1\Psi_{n-1}e^{i\theta}=E\Psi_n \quad \text{Equation (1)}$$

$\Psi_n$ comprises of the amplitudes of the medium 106 located at lattice site 108, labeled by an index n, and in general can be complex-valued.

$V_1$ is the coupling strength between a lattice site n and its nearest neighboring lattice sites n±1.

$V_2$ defines the modulation amplitude of the onsite energy as defined herein.

$$\lambda = \frac{V_1}{V_2},$$

the ratio of the coupling strength to the modulation amplitude.

E are eigenenergies associated with specific solution for $\Psi_n$

The cosine factor modulates the onsite energies at the lattice sites 108, as reflected by its dependence on the lattice site index n.

α is a rational number that can be represented by p/q, where p, q=1, 2, 3, . . . with (p, q)=1

The phase φ measures the phase shift of the modulation relative to the positions of the lattice sites.

The phase θ is the phase associated with the coupling between neighboring lattice sites.

Notably, in the form presented, Equation (1) can be applied to matter waves as well as to light with reinterpretations that do not impact the primary outcomes relevant to embodiments of the system 100 and methods disclosed herein.

For rational $\alpha=p/q$, after q sites, the modulation repeats since for $n=q$, $\cos(2\pi qp/q)=\cos(2\pi p)=\cos(0)$, so that the value of the net onsite energy $V_1 \cos(2\pi n\alpha)$ at lattice site $n=q$ is identical to that at lattice site $n=0$. Therefore, for rational $\alpha$, Equation (1) can be realized in a closed periodic ring of q sites. In contrast, if the parameter $\alpha$ were an irrational number, the modulation $\cos(2\pi n\alpha)$ would be different and distinct for every value of n, and never repeat and hence the lattice would be of infinite extent and cannot be mapped to a finite closed ring.

For a closed ring arrangement, the phase $\theta$ in Equation (1) can be shown to arise from or be directly impacted by rotation of the system or by proximity of magnetic fields; and because the solutions $\Psi n$ of the equation depends on the value of $\theta$, the distribution of the medium 106 among the lattice sites 108, as defined by $|\Psi n|^2$, and specifically the degree of localization of the medium 106 depends on the value of $\theta$. As used herein, operations that utilize this sensitivity will be referred to as extrinsic operation, since this will serve to detect rotation of the system 100 as a whole due to causes that may be extraneous to the system 100, or detect magnetic fields that maybe extraneous in origin.

For a closed ring arrangement, the phase (pin Equation (1) can be related to the degree of rotation or twisting of the potential that modulates the onsite energy relative to the potential that creates the lattice structure. Thereby, if the subparts 101 and 102 comprise of the two potentials referred to herein, and each subpart 101, 102 is connected to two separate objects 103 and 104 (which can be subparts of the same object), this phase $\varphi$ can be a measure of the twisting or relative rotation of the recited objects 103 and 104, which defines a separate component of operation. As used herein, operations that utilize this sensitivity will be referred to as intrinsic operation, since this involves relative rotation of different components of the system 100.

Embodiments of the sensor system 100 in which media 106 are confined to a ring-shaped artificial lattice structure 105 can be modeled using Equation (1) so that $\alpha=p/q$, implies q lattice sites with onsite energies modulated at period p. In an idealized model representation having an infinite number of lattice sites, $(p, q\to\infty)$ all the eigenstates are localized for $|\lambda|<\frac{1}{2}$ and are extended for $|\lambda|>\frac{1}{2}$. This transition from localization to extended distribution is also approximately true for a finite number of lattice sites arranged on closed ring, but the transition can be more gradual than it would be in the idealized model with infinite number of lattice sites.

The degree of localization of the medium 106 can be quantified by the inverse participation ratio, related to the statistical variance and defined as $IPR=\Sigma_n |\Psi_n|^4$, the absolute fourth power of the amplitudes of the medium 106 summed over all lattice sites 108, assuming the sum of the absolute squares to be normalized to unity $\Sigma_n |\Psi_n|^2=1$. When the medium 106 is localized on a single lattice site only, then $IPR=1$. Whereas, if it is uniformly spread over all the lattice sites, then $IPR=0$ in the limit of an infinite lattice, but $IPR\to 1/q$ for a finite lattice with q lattice sites.

Figure 12:
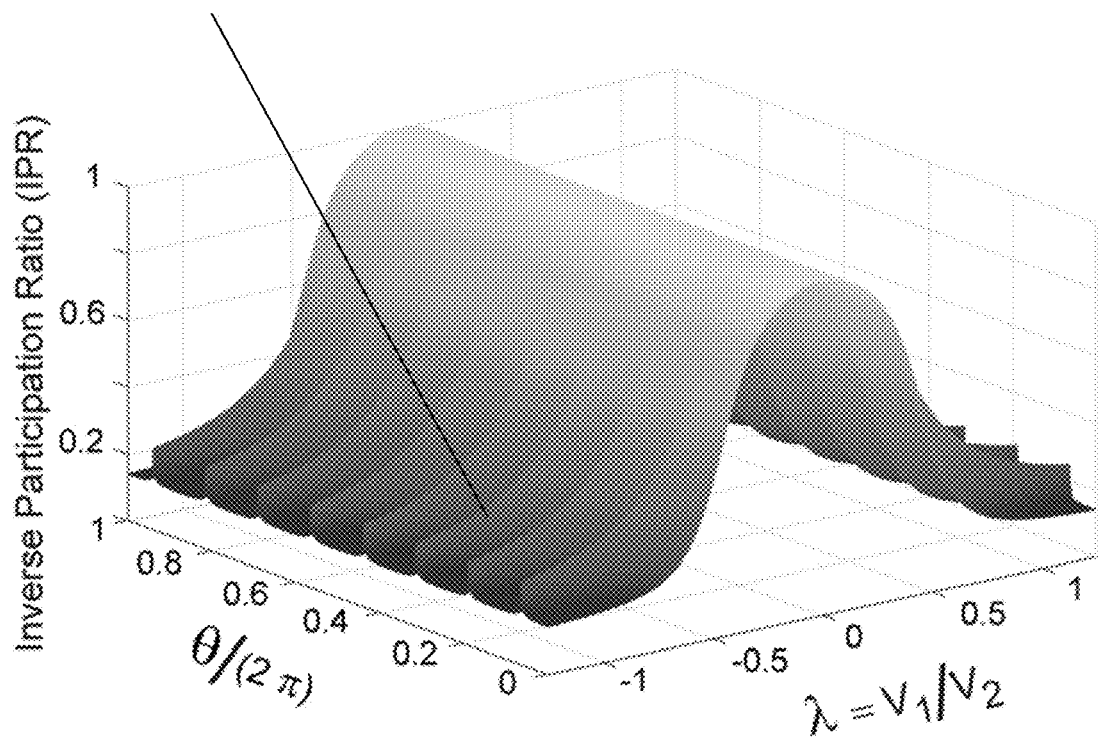
FIG. 12 is a plot of computed inverse participation ratio (IPR) that quantifies the localization in the case of extrinsic operation, shown for the ground state of in a tight-binding approximation for 8 lattice sites and with modulation period of 5. High values of IPR correspond to localization. A transition to delocalization is seen to occur around $|\lambda|=\frac{1}{2}$. However, in the delocalized regime $|\lambda|>\frac{1}{2}$, ridges are present, marking partial localization with dependence on phase $\theta$ in the regime in accordance with a derived equation that can be used for an embodiment of the sensor system.

FIG. 12 shows an exemplary inverse participation ratio (IPR) in the case of extrinsic operation, wherein the modulation phase $\varphi$ is constant and unchanging, and therefore, for the purpose of illustration only, is set to zero. The IPR is plotted on the vertical axis as a function of plotting variables $\lambda$ and $\theta$. The localization transition is clearly visible around $|\lambda|=\frac{1}{2}$, with localization occurring towards the center of the $\lambda$-axis, where $|\lambda|<\frac{1}{2}$. Since nature prefers states of lower energy, FIG. 12 specifically shows the IPR for the ground state or lowest energy eigenstate solution of Equation (1) for $\Psi n$, but this transition to localization to extended behavior is displayed by higher energy eigenstates as well.

FIG. 12 also shows that in the regime $|\lambda|>\frac{1}{2}$, the degree of localization shows significant dependence on $\theta$, whereby although the medium 106 is generally extended, the IPR periodically increases sharply, showing partial localization around specific values of the phase $\theta$. In contrast, there is no such dependence for $|\lambda|<\frac{1}{2}$, particularly away from the critical value of $|\lambda|=\frac{1}{2}$. Such dependence, although shown here for the lowest eigenstate, is also evident for higher energy eigenstates. It can be shown that non-vanishing $\theta$ in the exponential factor $e^{\pm i\theta}$ arises due to, and its value proportional to the degree/strength of: (1) angular velocity associated with rotation of the system and/or (2) a vector potential due to the proximity of a gauge field such as a magnetic field. Therefore, if the system 100 is prepared such that medium 106 corresponds to an eigenstate or a superposition of eigenstates that share partial localization around the same values of $\theta$, then by calibrating the sensor system 100 to be near one of the sharp increases in localization, a measurement of the degree of localization of the medium 106 via its IPR will determine variations in the phase $\theta$ and hence the presence of as well as the degree/strength of rate of rotation and/or vector potential associated with magnetic fields.

Figure 13:
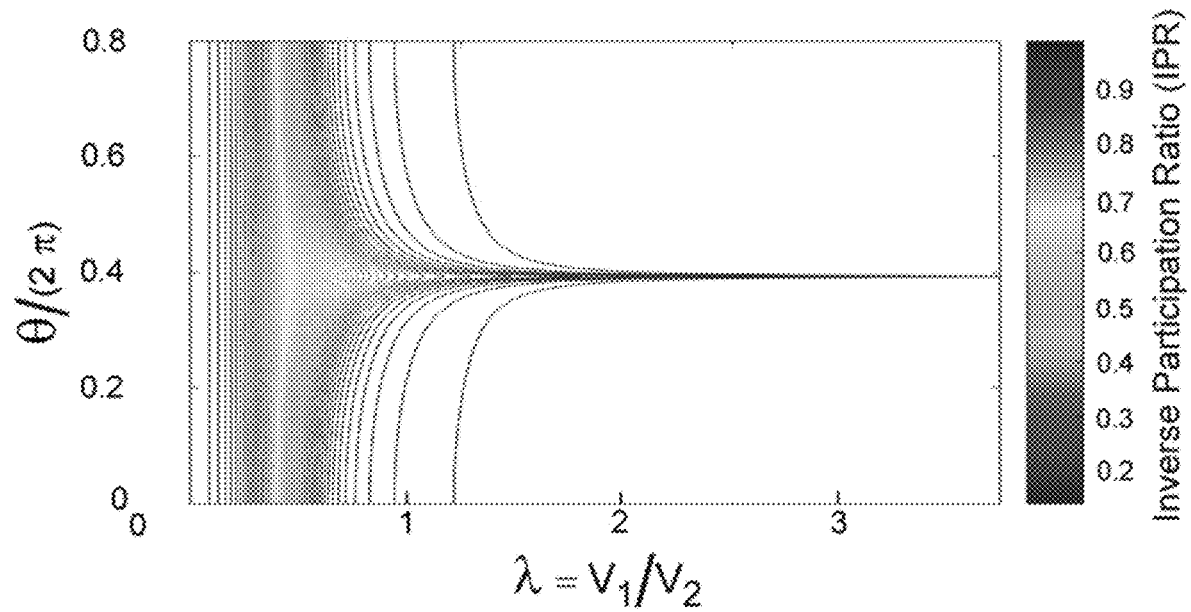
FIG. 13 is a contour plot of a top view of the IPR for a section of FIG. 12, demonstrating the progressive narrowing of a ridge marking partial localization, indicating heightened sensitivity to the phase $\theta$.

FIG. 13 shows a contour plot of a top view of a section of FIG. 12 centered on a region where a phase-sensitive ridge-like feature occurs in the IPR. It shows that for larger values of the phase-sensitive ridge-like feature becomes increasingly sharp, which can be an indicator of enhanced sensitivity to the changes in the phase $\theta$.

Quantifying the sensitivity can be achieved via Fisher information, which is a widely accepted objective gauge of the sensitivity of a measurement that can be used to compare completely different processes. It is defined in Equation (2) as:

$$F(\theta) = \sum_n \left[\frac{\partial}{\partial \theta}\log P_n(\theta)\right]^2 P_n(\theta) \qquad \text{Equation (2)}$$

$F(\theta)$ is the Fisher information about the variable of interest $\theta$ n is the relevant domain, and in the current context the index labeling the lattice sites.

Figure 14:
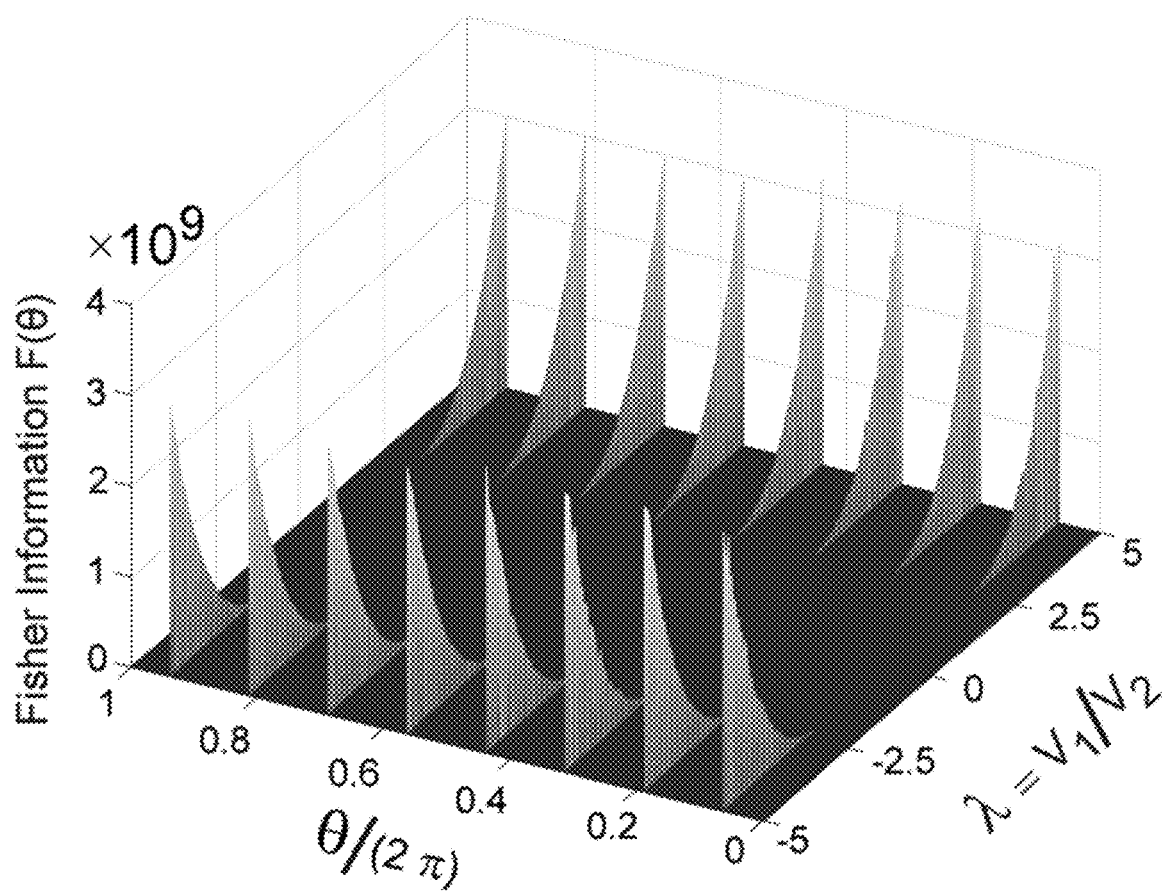
FIG. 14 shows the Fisher information corresponding to FIG. 12, showing high values at the positions of the ridges. High Fisher information indicates high level of information about the parameter of interest $\theta$ contained in the observable, which is the distribution of the medium among the lattice sites.

$P_n(\theta)$ is the probability distribution function and in the current context equal to $|\Psi n|^2$ A high value of the Fisher information indicates higher sensitivity. FIG. 14 shows that near the locations of the phase-sensitive ridge-like features, the Fisher information for an embodiment of the system 100 can reach values approximating $3\times 10^9$, a value that will be subsequently shown to be a substantial improvement over conventional methods and systems. Significantly, the upward trend indicates that even higher values are possible for larger magnitudes of $\lambda$.

Figure 15:
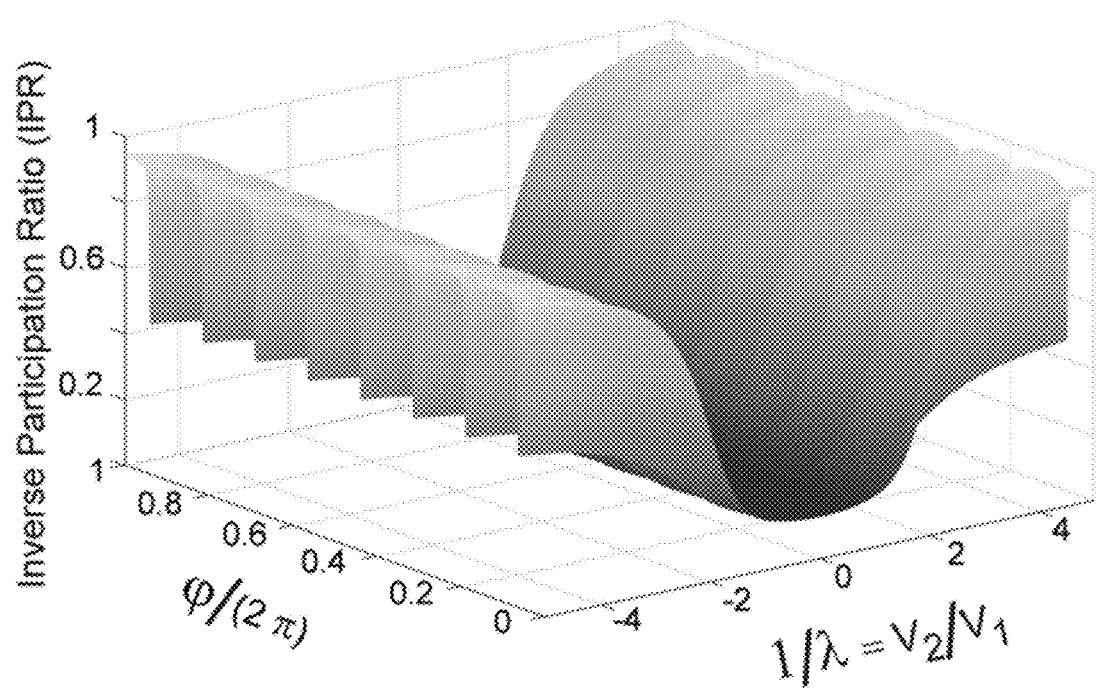
FIG. 15 is the counterpart of FIG. 12 for intrinsic operation, and shows an exemplary IPR in the case of intrinsic operation. In the localized regime, dips are present marking partial delocalization with dependence on the phase $\varphi$ in the regime in accordance with a derived equation that can be used for an embodiment of the sensor system.

FIG. 15 shows an exemplary inverse participation ratio (IPR) in the case of intrinsic operation, wherein the modulation phase $\theta$ is constant and unchanging, and therefore, for the purpose of illustration only, is set to zero. The IPR is plotted on the vertical axis, but now differently from the extrinsic case discussed above, it is plotted as a function of plotting variables $1/\lambda$ and $\varphi$. The transition is clearly visible around 1/|λ|=2, which corresponds to |λ|=½. Since the plotting variable is 1/λ instead of λ, the localization pattern reflected in the IPR is also inverted, meaning it displays localization away from the center where 1/|λ|>2 which corresponds to |λ|<½. As in FIG. 12, and for the same reasons, the FIG. 15 also specifically shows the IPR for the ground state solution of Equation (1) for Ψn, but the transition to localization to extended behavior is displayed by higher energy eigenstates as well.

FIG. 15 also shows that in the regime 1/|λ|>2, which corresponds to |λ|<½, the degree of localization shows significant dependence on φ, whereby although the medium 106 is generally localized, the IPR periodically decreases sharply, showing partial delocalization around specific values of the phase φ. In contrast, there is no such dependence for 1/|λ|<2 which corresponds to |λ|>½, particularly away from the critical value of 1/|λ|=2. This dependence although shown here for the lowest eigenstate is also evident for higher eigenstates. As defined in Equation (1) the phase shift φ of the modulation is relative to the lattice sites. Hence, φ can serve as the measure of relative rotation of two systems (one coupled to the potential that creates the modulation and the other to the potential that creates the lattice sites). If the system is prepared such that medium 106 corresponds to an eigenstate or a superposition of eigenstates that share such partial delocalization around the same values of φ, then by calibrating the sensor system 100 to be near one of the sharp decreases in localization, a measurement of the degree of localization of the medium 106 (due to relative rotation) can be made by measuring the variations of the phase φ.

Figure 16:
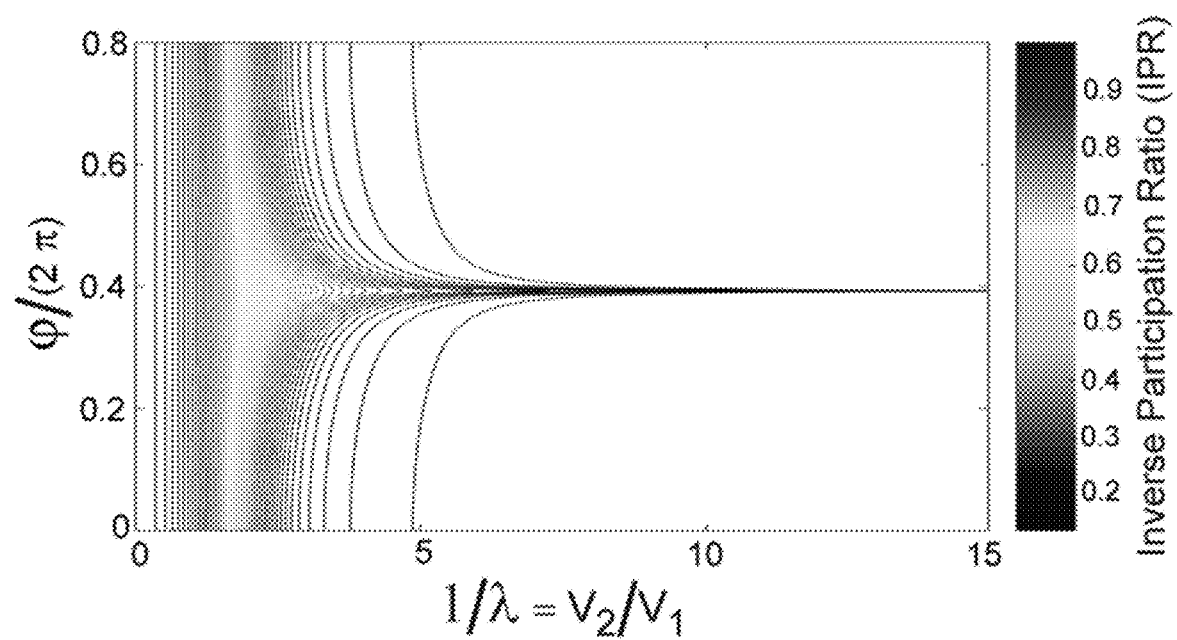
FIG. 16 is the counterpart of FIG. 13 for intrinsic operation, and shows a contour plot of a top view of a section of FIG. 15, demonstrating the progressive narrowing of a dip marking partial delocalization, indicating heightened sensitivity to the phase $\varphi$.

FIG. 16 shows a contour plot of a top view of a section of FIG. 14 centered on a region where a phase-sensitive dip-like feature occurs in the IPR. It shows that for larger values of 1/|λ|, the phase-sensitive dip-like feature becomes increasingly sharp, which can be an indicator of enhanced sensitivity to the changes in the phase φ.

Figure 17:
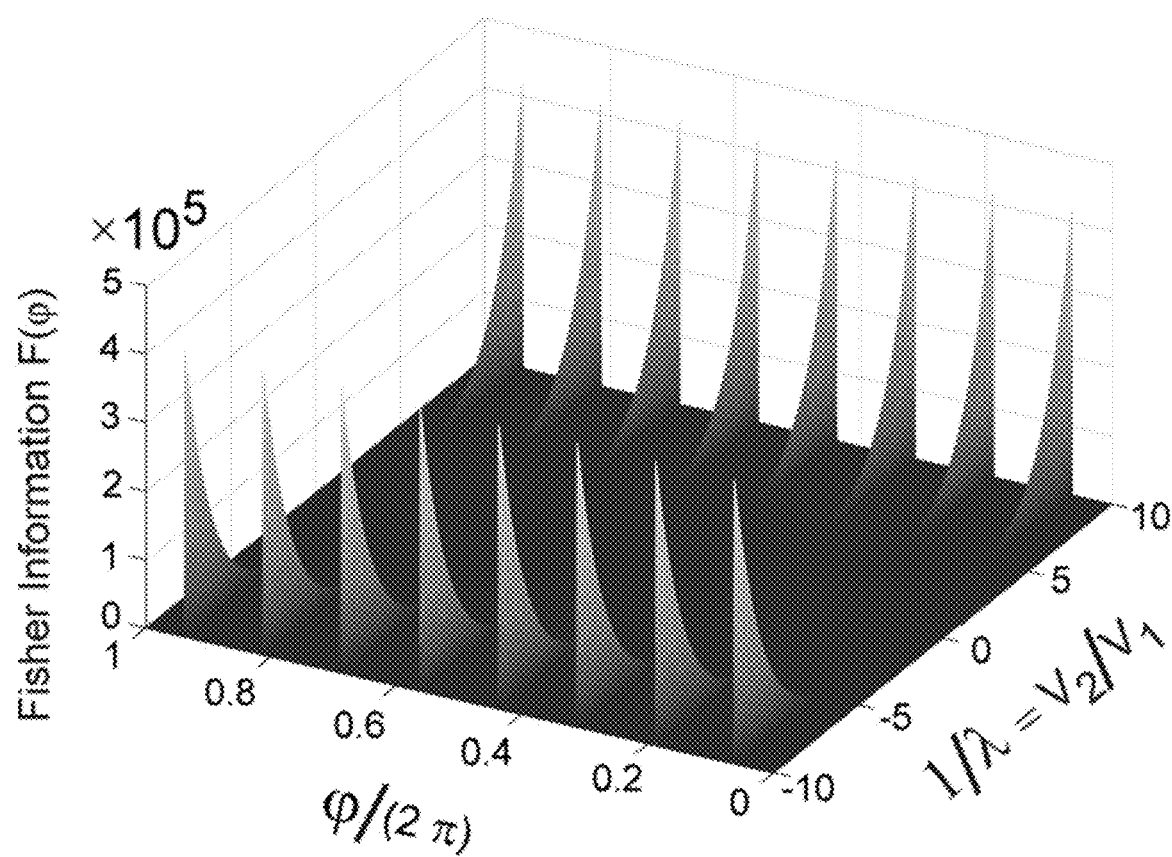
FIG. 17 is the counterpart of FIG. 14 for intrinsic operation, and shows the associated sensitivity for intrinsic operation quantified by the Fisher information, but with the phase $\theta$ replaced by the phase $\varphi$, and plotted versus $(1/\lambda, \varphi)$ instead of $(\lambda, \theta)$.

FIG. 17 shows the associated sensitivity in intrinsic operation quantified by the Fisher information as defined above in Equation (2), but the parameter θ replaced by the parameter φ, and plotted versus (1/λ,φ) instead of (λ,θ). FIG. 17 shows that near the locations of the phase-sensitive dip-like features, the Fisher information for an embodiment of the system 100 in intrinsic operation can reach values approximating 4×10$^5$, and the upward trend indicating even higher values possible for larger magnitudes of 1/λ. This value will be subsequently shown to be significant improvement over conventional methods and systems.

It should be noted that for extrinsic operation (e.g., FIG. 12), the tendency to delocalize should be in the regime where, in the absence of rotation and proximate magnetic field, the medium 106 would be almost completely delocalized, which corresponds to regimes with values of |λ|>½ if the system can be described by Equation (1) or modified variations of it specific to an embodiment. For intrinsic operation (e.g., FIG. 15), the tendency to localize should be in the regime where, in the absence of rotation, the medium 106 would be almost completely localized, which corresponds to regimes with values of 1/|λ|>2 if the system can be described by Equation (1) or modified variations of it specific to an embodiment. With rotation, entire or relative and/or proximate magnetic field, partial localization or partial delocalization can occur.

In the case of both extrinsic and intrinsic operation, the determination of the direction or the orientation of the rotation, as in right-handed or left-handed, clockwise or anticlockwise, can be determined for example by calibrating the sensor system 100 to be appropriately proximate to one of the partial localization ridges or partial delocalization dips, but not exactly at the local extremum of that specific ridge or the dip. Change in the phases θ or φ induced by extrinsic and intrinsic rotation respectively will cause the IPR to increase or decrease depending on the direction of the rotation. The same principle can allow the determination of the orientation of the magnetic field or potential.

In some embodiments, it may be more convenient to initiate the medium 106 in something other than a specific eigenstate or specific superposition of eigenstates, and then allow the medium 106 to evolve in time. Such scenarios can be described by the time-dependent Schrödinger equation corresponding to Equation (1) that we refer to as Equation (3)

$$V_2\Psi_{n+1}e^{-i\theta} + V_1\cos(2\pi n\alpha + \varphi)\Psi_n + V_2\Psi_{n-1}e^{i\theta} = i\frac{\partial}{\partial t}\Psi_n \quad \text{Equation (3)}$$

Notably, in this form Equation (3) applies to matter waves as well as to light propagation, with reinterpretations that do not impact the primary outcomes relevant to embodiments of the system 100 and methods disclosed herein. This equation allows any suitable initial choice of amplitude Ψn(t=0) to be evolved in time subject to the potentials (as described by the left hand side of the equation) the medium 106 is subjected to until the time of measurement, t=T. The amount time from an initial time t=0 until the time of measurement t=T will be referred to herein as duration of evolution. All preceding discussion herein continues to apply with the only modification that the state of interest be the time-evolved state Ψn(t=T), including in determining the distribution of the medium |n(t=T)|$^2$ and the IPR=$\Sigma_n|\Psi_n(t=T)|^4$.

Figure 18:
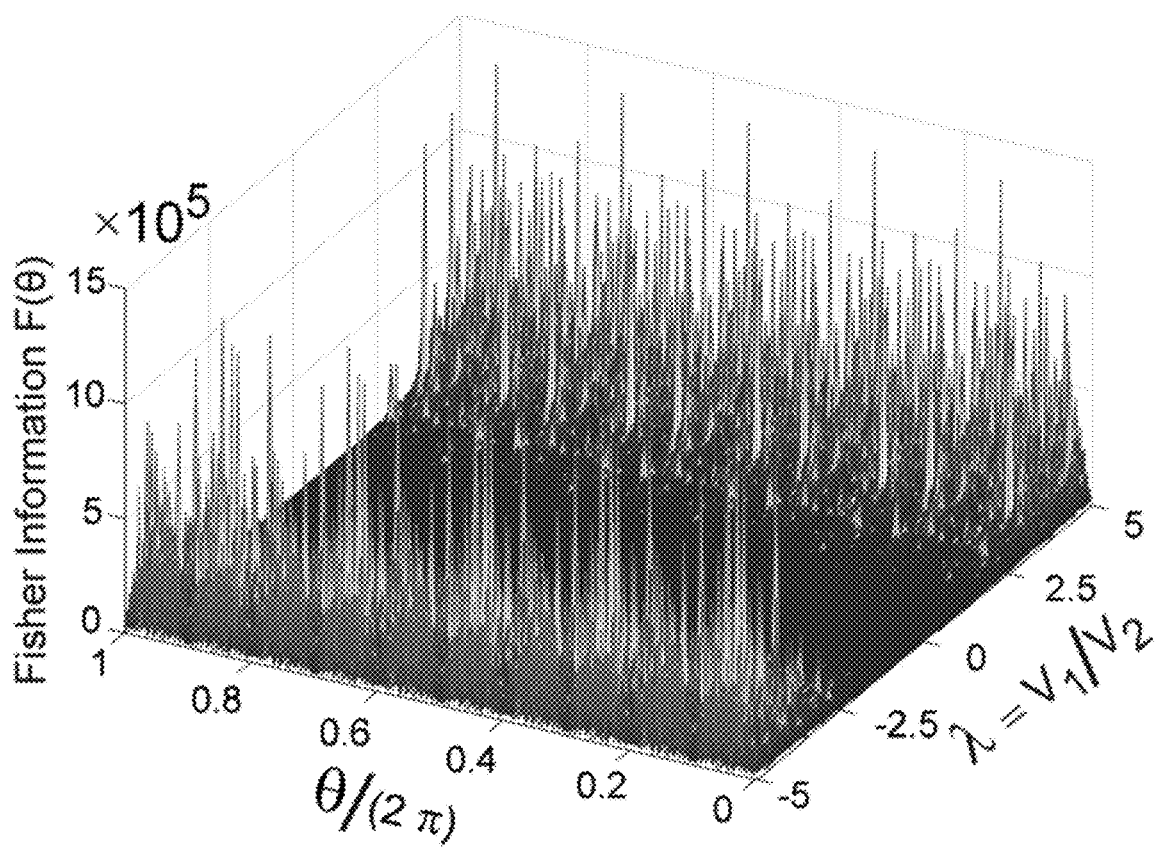
FIG. 18 shows the Fisher information for extrinsic operation computed for the time-evolved state $\Psi n(t=T)$ with an initial state $\Psi n(t=0)$ that is completely localized, with duration of evolution T=10 units in accordance with a derived equation.
Figure 19:
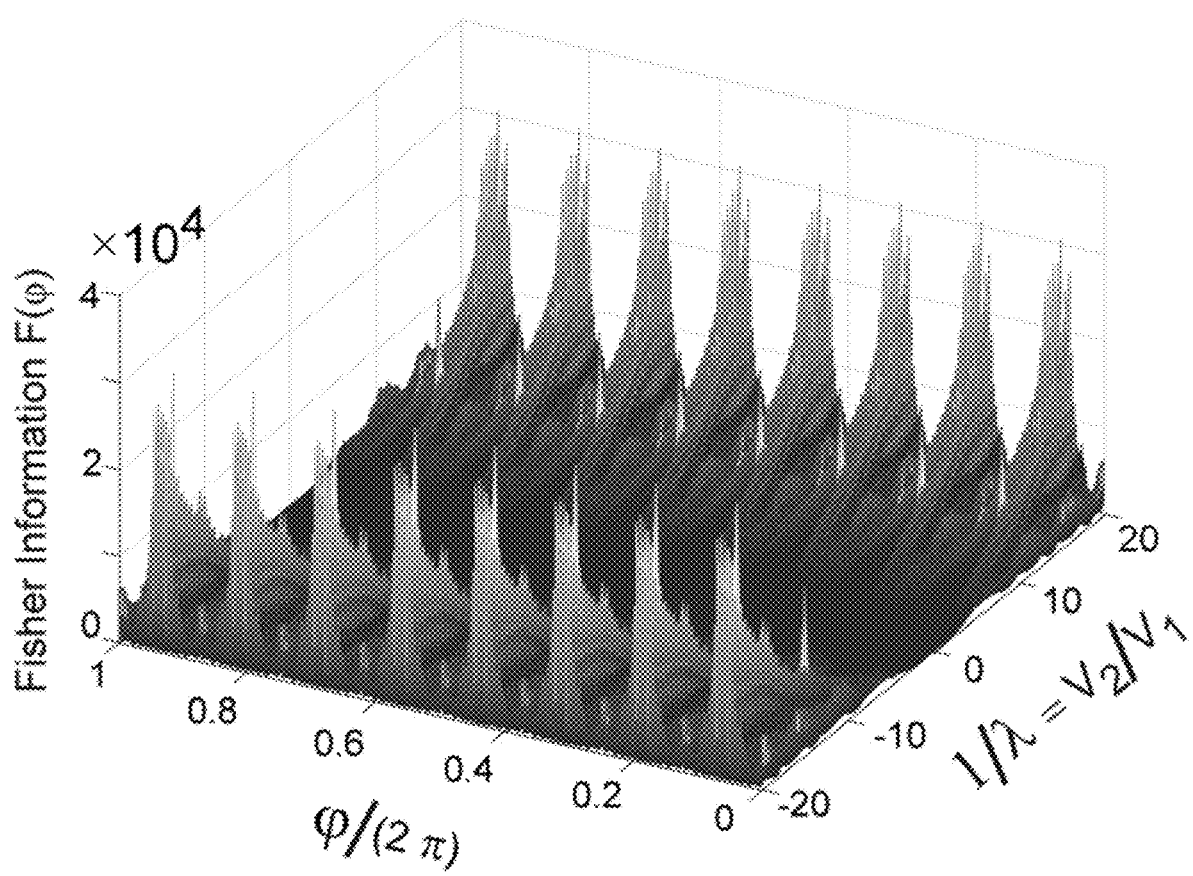
FIG. 19 shows the Fisher information for extrinsic operation computed for the time-evolved state $\Psi n(t=T)$ with an initial state $\Psi n(t=0)$ that is completely delocalized, with duration of evolution T=10 units in accordance with a derived equation.

FIG. 18 shows the Fisher information for extrinsic operation for the time-evolved state Ψn(t=T) and FIG. 19 shows the same for intrinsic operation. They utilize and illustrate different initial conditions, with the initial state Ψn(t=0) starting from being completely localized for the extrinsic case but starting from being completely delocalized for the intrinsic case. Both demonstrate high values of Fisher information comparable to counterparts computed using the respective ground states in FIG. 14 and FIG. 17. There can be an advantage that in this case, the value is more uniformly high across the entire range of the variables of interest θ and φ instead of at very specific values. Additionally, there continues to be an upward trend as parameter λ (for extrinsic) or its inverse 1/λ (for intrinsic) is increased indicating even higher values are possible for the Fisher information.

The Fisher information can be compared with that for Sagnac interferometry that provides the basis for conventional high precision rotation sensing. A Sagnac interferometer involving a circular path of radius R where an input wavepacket comprising a medium originates at one part of the circle, is split into two, each part traverses in opposite directions and the two parts recombine at the diametrical opposite side of the circular path, has Fisher information estimated for matter waves by Equation (4):

$$F_{Sagnac} = (2\pi R^2)^2 = \left(\frac{4\tau^4}{\pi^2}\right) \quad \text{Equation (4)}$$

Here units are assumed consistent with those implicit in Equations (1) and (3), and specifically the velocity of propagation is set to unity, so the length traversed is equivalent to the time elapsed, and hence time (distance) to recombination is equal to half the circumference length $\tau=\pi R$, which clarifies the second form presented above. For fair comparison this is evaluated with $\tau=T$, the time that the wavefunction of the medium is allowed to evolve until measurement.

Figure 20:
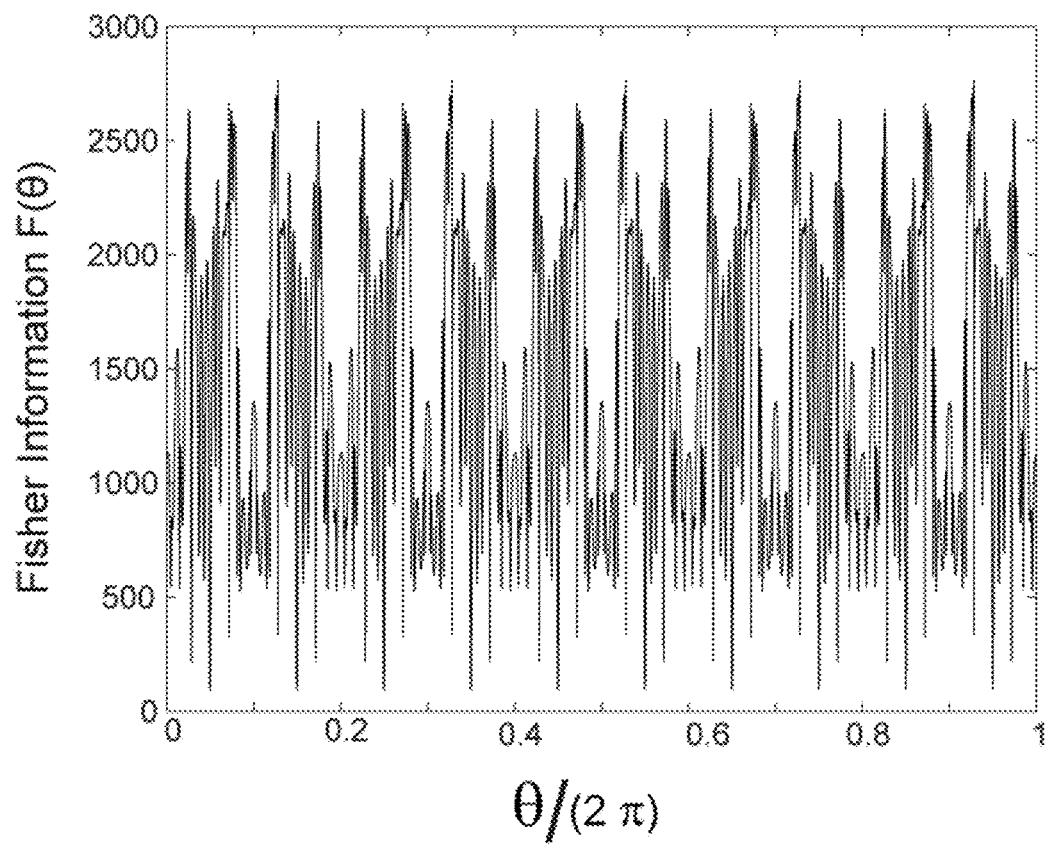
FIG. 20 shows the Fisher information for extrinsic operation for $\lambda=5$ and duration of evolution T=1 units in accordance with a derived equation.
Figure 21:
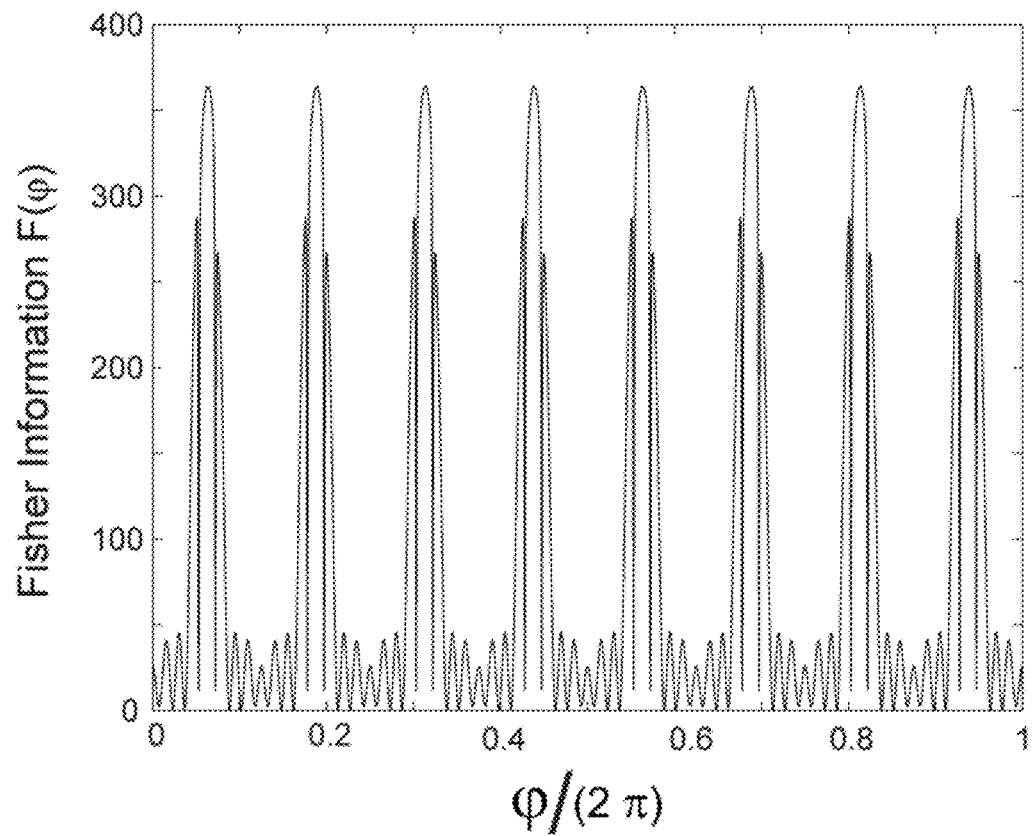
FIG. 21 shows the Fisher information for intrinsic operation for 1/λ=20 and duration of evolution T=1 units in accordance with a derived equation.

FIG. 20 is the Fisher information for extrinsic operation shown for T=1 and $\lambda=5$ and FIG. 21 is the same for intrinsic operation but for $1/\lambda=20$. From Equation (3) the values of the Fisher information for a comparable Sagnac interferometer is 0.405, demonstrating the substantially improved sensitivity of this invention for intrinsic and extrinsic operation. In FIG. 18 and FIG. 19, time of propagation was longer T=10 which resulted in a much higher value of the Fisher information. For comparison, for $\tau=10$, the Fisher information for Sagnac interferometry referenced above also rises to a value of 4050, which is still significantly less than is achievable for this invention as seen from the recited figures.

In some embodiments, the medium 106 can self-interact with itself, which can manifest as nonlinear behavior. For example, when the medium 106 comprises of ultracold atoms, each atoms can interact with other atoms. This can have the effect of altering the behavior of the medium 106 as regards its degree of localization that can influence the sensitivity of the degree of localization to rotation, entire or relative, and proximity of magnetic field, which can include instances of enhancing the sensitivity. Such self-interaction of the medium 106 can in some embodiments be utilized for improving the sensitivity or precision of measurement of amount of and/or the rate of rotation, entire or relative, and/or the proximity and strength of magnetic potentials and/or magnetic fields.

Figure 10:
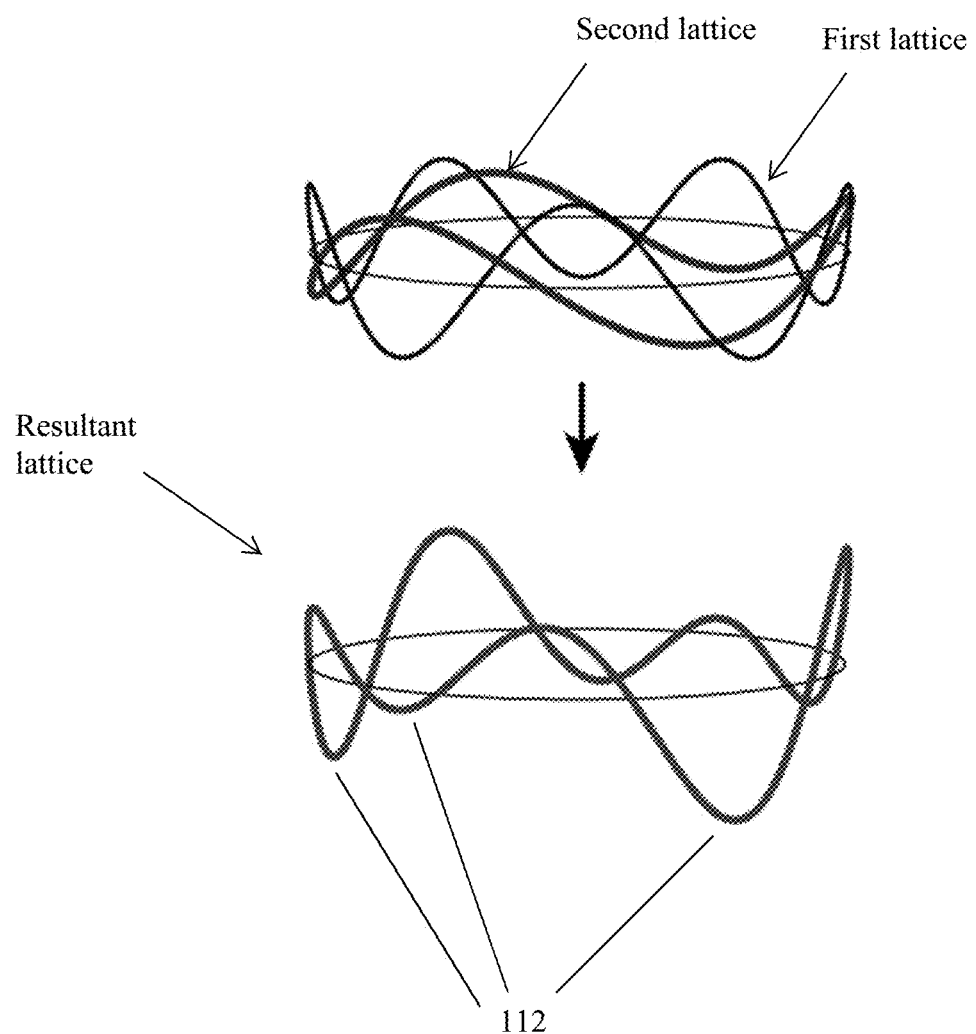
FIG. 10 illustrates how two sinusoidal confining potentials around the ring, but of different periodicities, can be utilized, with one lattice serving as the lattice structure and the second lattice providing the modulation of the onsite energies at the lattice sites. The two periodic potentials are first shown separately, and then their sum is shown. A circle is drawn as a reference for the degree of undulation of the potentials around the ring.

It should be noted that the discrete lattice model of FIG. 9 is exemplary of an idealized state, where the lattice sites 108 are denoted as uniformly spaced discrete locations with modulation of onsite energies that follow a sinusoidal pattern. In practice, lattice sites 108 can be created by periodic undulation of some potential energy experienced by the medium 106 (this is a separate potential imposed on the medium 106 in addition to the potential that creates the modulation of onsite energies). In some embodiments, a superimposition of two sinusoidal potentials can be used to generate two lattices of slightly different periodicities such that both can span the same physical space and can be merged together to produce a new composite lattice which is periodic on a longer spatial scale. For example, FIG. 10 shows a first lattice having five minima formed by a first sinusoidal potential and a second lattice having three minima formed by a second sinusoidal potential, the first and the second sinusoidal potentials being superimposed or merged to generate the desired artificial lattice structure.

Figure 11:
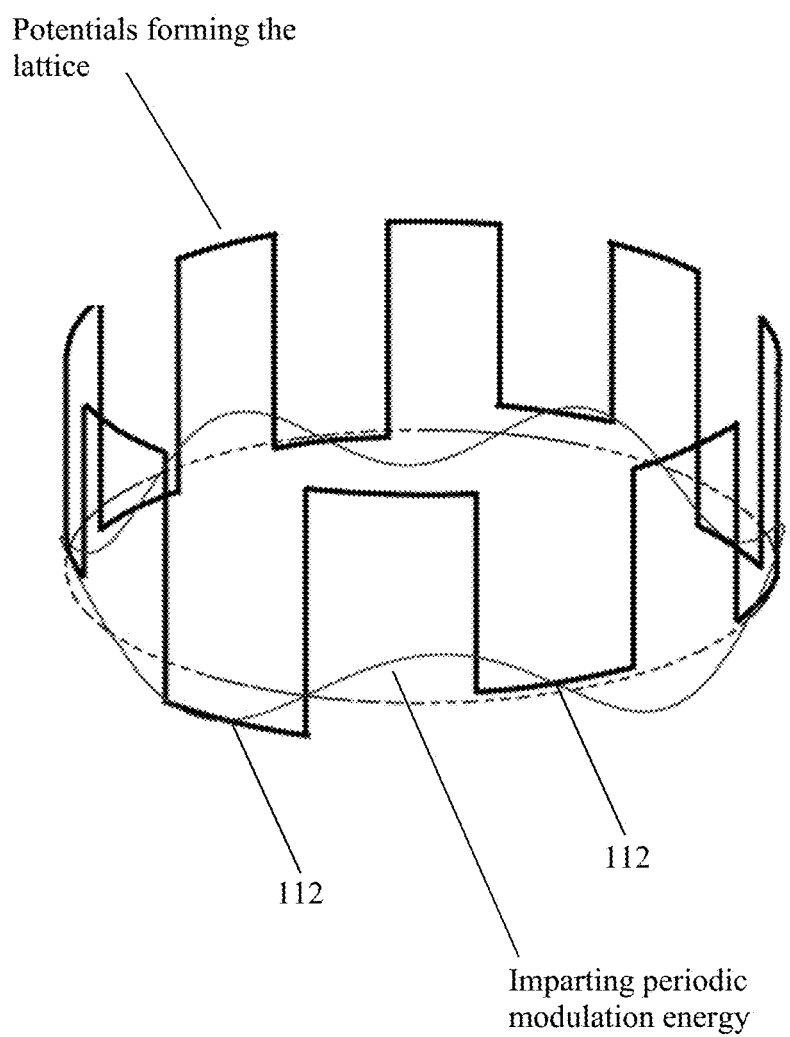
FIG. 11 illustrates how the basic lattice structure can be a sequence of uniformly spaced rectangular potential wells, while the depth of each potential well is modulated following a sinusoidal function of a different period than that of the rectangular lattice.

Periodic forms other than sinusoidal functions can be used, such as rectangular potentials (see FIG. 11), triangular potentials, etc. The shape of the potentials (and hence the shape of the potential wells) may be beneficial for particular applications, but it is the periodic structure of the potential wells and the modulation of depths of the potential wells that are important for purposes of causing variations in and detecting the degree of localization of the medium 106.

For any specific embodiment, the system can be prepared with the medium 106 in some known state described by amplitude $\Psi n(t=0)$, and after a specific time T the density distribution of the medium 106 as quantified by $|\Psi n(t=T)|^2$ can be detected, as some examples have been given above for different embodiments. Based on the functionality desired, if the system 100 has been subject to rotation, entire or relative, and/or subjected to a magnetic potential and/or proximate magnetic field, the density distribution of the medium 106 will have changed in proportion to the rate of rotation (for extrinsic operation) or the amount of rotation (for intrinsic operation) or the strength of the magnetic potential and/or proximity of the associated magnetic field. With proper calibration, the density distribution of the medium 106, via the IPR, will serve as a precise measure of the amount and/or rate of rotation and/or the strength of the magnetic potential and/or proximate magnetic field.

In at least one embodiment, a sensor system 100 can include an artificial lattice structure configured to confine a medium 106 to a plurality of lattice sites 108 arranged in the shape of a closed ring. The artificial lattice structure can have lattice period that defines a distance between each lattice site 108. Each lattice site can be defined as a potential well having a site depth 112. A modulation mechanism can be used for varying the site depth 112 of any one or combination of lattice sites 108 of the plurality of lattice sites 108. This can be done in accordance with a modulation period. The modulation period can be different from the lattice period. A magnitude of the modulation can be defined by a modulation amplitude. The medium 106 can include a property of being able to migrate among the plurality of lattice sites 108. The propensity of migration can be defined by a coupling strength among the plurality of lattice sites 108. The sensor system 100 can be configured to generate an output that is a function of the distribution of the medium 106 in the artificial lattice structure.

The sensor system 100 can further include an artificial lattice structure generating apparatus configured to generate the artificial lattice by continuous variation of an energy field or a structure to which the medium 106 is sensitive so as to create a plurality of local minima where the medium 106 congregate. Each of the local minimum defines a location of a lattice site 108.

The modulation mechanism can be configured to modulate any one or combination of the site depth 112 and the coupling strength.

The artificial lattice can include a coherent light source (e.g., a laser) configured to generate photons as the medium 106. The artificial lattice can further include a plurality of waveguides 110 configured to propagate the photons. Each waveguide 110 can be set as a lattice site 108 arranged in the closed ring-shape. The modulation mechanism can include an apparatus for tuning a refractive index of each waveguide 110.

The artificial lattice can include a modulated ring-shaped interference pattern of light comprising a first set of light beams and a second set of light beams. For instance, a pair of primary laser light sources can generate the first set of light beams comprising a first primary light beam and a second primary light beam. Each of the first primary light beam and the second primary light beam can have internal orbital angular momentum, wherein the first primary light beam is characterized by an azimuthal mode index that differs from an azimuthal mode index of the second primary light beam such that the interference of the first primary light beam and the second primary light beam creates a ring-shaped interference pattern of alternating dark and bright intensities to generate the plurality of lattice sites 108. A pair of secondary laser light sources can generate the second set of light beams comprising a first secondary light beam and a second secondary light beam. Each of the first secondary light beam and the second secondary light beam can have internal orbital angular momentum, wherein the first secondary light beam is characterized by an azimuthal mode index that differs from an azimuthal mode index of the second secondary light beam such that the interference of the first secondary light beam and the second secondary light beam creates a ring-shaped interference pattern of alternating dark and bright intensities. The azimuthal mode indices of the second set of light beams can differ from the azimuthal mode indices of the first set of light beams so that the ring-shaped interference pattern formed by the second set of light beams occurs at a periodicity that differs from a periodicity of the ring-shaped interference pattern formed by the first set of light beams. The modulation mechanism can be configured to cause the ring-shaped interference pattern formed by the second set of light beams to overlap with the ring-shaped interference pattern formed by the first set of light beams to generate the modulated ring-shaped interference pattern. The medium 106 can be confined within the modulated ring-shaped interference pattern. The modulation mechanism can include an apparatus for adjusting power of each of the primary laser light sources and the secondary laser light sources to tune the coupling strength and the modulation amplitude. The system 100 can further include an additional light source configured to generate a lightsheet to further confine the medium 106.

The system 100 can further include an apparatus for generating the atoms or molecules as the medium 106. The apparatus can be configured to place the atoms or the molecules in an ultracold state to generate ultracold atoms or molecules as the medium 106, wherein the atoms or the molecules display quantum mechanical features of coherent matter waves.

The system 100 can further include an apparatus for adjusting the azimuthal mode indices and the internal orbital angular momenta of the first set of light beams and the second set of light beams to adjust and control the lattice period and the modulation period.

In some embodiments, the artificial lattice comprises a substrate having a first material and a plurality of second material formations within the first material. The first material can have an energy bandgap that is wider than an energy bandgap of the second material. The second material formations can be configured to confine the medium 106. The plurality of second material formations can be arranged in the closed ring-shape. The substrate can be configured as a transistor having a source terminal, a drain terminal, and a gate terminal. The modulation mechanism can include an apparatus for adjusting voltage applied to the transistor.

The second material formations can be configured to confine the medium 106 in an array of quantum wells. The system 100 can further include a detection unit configured to receive the output. The detection unit can be a chargecoupled device (CCD). The detection unit can be a device configured to image medium 106. The detection unit can be a device configured to measure current flow from the array of quantum wells. The medium 106 can be any one or combination of particles that carry electric charge.

The system 100 can further include a processor configured to determine the degree of localization of the medium 106 in the artificial lattice structure.

In one embodiment, a method for sensing rotation can involve adjusting the modulation mechanism and/or the coupling strength among neighboring lattice sites of the sensor system 100 so that a ratio of the coupling strength to the modulation amplitude causes the medium 106 to have a tendency to delocalize or have a tendency to localize. The method can involve introducing the medium 106 so as to be distributed among the plurality of lattice sites 108 according to a predetermined distribution function. The method can involve allowing the medium 106 to exist or evolve in the sensor system 100 for a predetermined period of time. The method can involve measuring distribution of the medium 106 among the plurality of lattice sites 108 and quantifying the degree of localization of the medium 106. The method can involve detecting rotation by determining amount of rotation and/or the rate of rotation via a calibration of degree of localization to the amount of rotation and/or the rate of rotation.

Detecting rotation can involve measuring extrinsic rotation, wherein the modulation mechanism is adjusted so that the ratio of the coupling strength to the modulation amplitude causes the medium 106 to have a tendency to delocalize in the absence of any rotation. The presence of rotation causes partial localization in proportion to a rate of rotation.

Detecting rotation can involve detecting relative rotation of a first component and a second component, wherein: the first component comprises the artificial lattice structure and a first object attached thereto; the second component comprises the modulation mechanism and a second object attached thereto; the modulation mechanism and/or the coupling strength are adjusted so that the ratio of the coupling strength to the modulation amplitude causes the medium 106 to have a tendency to localize in the absence of any rotation. The presence of rotation causes partial delocalization in proportion to the rotation.

In one embodiment, a method for sensing magnetic fields and/or magnetic potentials can involve adjusting the modulation mechanism and/or the coupling strength of the sensor system 100 recited in claim 1 so that a ratio of the coupling strength to the modulation amplitude causes the medium 106 to have a tendency to delocalize in the absence of magnetic fields and/or magnetic potentials. The method can involve introducing the medium 106, the medium 106 carrying electric charge, so as to be distributed among the plurality of lattice sites 108 according to a predetermined distribution function. The method can involve allowing the medium 106 to exist or evolve in the sensor system 100 for a predetermined period of time. The method can involve measuring the distribution of the medium 106 among the plurality of lattice sites 108 and quantifying the degree of localization of the medium 106. The method can involve detecting a magnetic potential and/or proximity of a magnetic field and measuring their strengths by calibration of the degree of localization to the magnitude of magnetic potential and/or the magnitude of the magnetic field.

Practical applications for embodiments of the system 100 and methods disclosed herein can be in the realm of very high precision measurements of rotation. The advantage lies in the potentially much higher sensitivity achievable, so that minuscule rotations and fields can be detected that may be beyond conventional methods. Precision rotation sensing is relevant in stabilization involving gyroscopy in both military and civilian applications. Additional applications can be in high precision devices for scientific experiments.

Potential applications in sensing magnetic fields can compete in any applications where currently SQUID (Superconducting Quantum Interference Device) technology is used. Embodiments of the system 100 provide an entirely different operation principle from SQUID and have the advantage of very high sensitivity achievable at significantly faster time of operation than may be necessary with other technology. Such applications include medical applications such as in Magnetoencephalography, magnetogastrography, magnetic field imaging as alternates to MRI NMR technologies; additional applications include measuring properties of samples; other applications include in the field of geology such as in oil prospecting. Military applications can include magnetic anomaly detection in anti-submarine warfare.

It should be understood that modifications to the embodiments disclosed herein can be made to meet a particular set of design criteria. For instance, the number of or configuration of lattice structures 105, waveguides 110, light sources 114, 118, 124, 130, detection units 140, and/or other components or parameters may be used to meet a particular objective.

It will be apparent to those skilled in the art that numerous modifications and variations of the described examples and embodiments are possible in light of the above teachings of the disclosure. The disclosed examples and embodiments are presented for purposes of illustration only. Other alternative embodiments may include some or all of the features of the various embodiments disclosed herein. For instance, it is contemplated that a particular feature described, either individually or as part of an embodiment, can be combined with other individually described features, or parts of other embodiments. The elements and acts of the various embodiments described herein can therefore be combined to provide further embodiments.

Therefore, it is the intent to cover all such modifications and alternative embodiments as may come within the true scope of this invention, which is to be given the full breadth thereof. Additionally, the disclosure of a range of values is a disclosure of every numerical value within that range, including the end points. Thus, while certain exemplary embodiments of apparatuses and methods of making and using the same have been discussed and illustrated herein, it is to be distinctly understood that the invention is not limited thereto but may be otherwise variously embodied and practiced within the scope of the following claims.

I claim:

1. A sensor system, comprising:
an artificial lattice structure configured to confine a medium to a plurality of lattice sites arranged in the shape of a closed ring, the artificial lattice structure having a lattice period that defines a distance between adjacent lattice sites, wherein each lattice site is defined as a potential well having a site depth; and
a modulation mechanism for varying the site depth of any one or combination of lattice sites of the plurality of lattice sites, in accordance with a modulation period, the modulation period being different from the lattice period, and a magnitude of the modulation defined by a modulation amplitude; and
wherein the medium comprises a property of being able to migrate among the plurality of lattice sites, with a propensity of migration defined by a coupling strength between adjacent lattice sites;
wherein the sensor system is configured to generate an output that is a function of the distribution of the medium in the artificial lattice structure;
wherein the modulation mechanism is configured to generate a ratio of the coupling strength to the modulation amplitude that causes the medium to have a tendency to delocalize or have a tendency to localize; and
wherein the degree of localization is sensitive to presence of rotation, intrinsic or extrinsic, and to magnitude and/or rate of the rotation and/or to orientation of the rotation; and
wherein, when the medium is a charged medium, the degree of localization is sensitive to presence of a magnetic field and to magnitude and/or orientation of that magnetic field.

2. The sensor system recited in claim 1, further comprising an artificial lattice structure generating apparatus configured to generate the artificial lattice by continuous variation of an energy field or a structure to which the medium is sensitive so as to create a plurality of local minima where the medium congregates, wherein each of the local minimum defines a location of a lattice site.

3. The sensor system recited in claim 1, wherein the lattice period and the modulation period are commensurate with each other such that the complete circumference of the closed ring accommodates an exact positive integer multiple of the lattice period and an exact positive integer multiple of the modulation period.

4. The sensor system recited in claim 1, wherein the modulation mechanism is configured to modulate any one or combination of the site depth and the coupling strength.

5. The sensor system recited in claim 1, wherein the artificial lattice comprises:
a coherent light source configured to generate photons as the medium; and
a plurality of waveguides configured to propagate the photons, wherein each waveguide is set as a lattice site arranged in the closed ring-shape;
wherein the modulation mechanism includes an apparatus for tuning a refractive index and/or the coupling strength of each waveguide.

6. The sensor system recited in claim 1, wherein the artificial lattice comprises a modulated ring-shaped interference pattern of light comprising a first set of light beams and a second set of light beams, wherein:
a pair of primary laser light sources generates the first set of light beams comprising a first primary light beam and a second primary light beam, each of the first primary light beam and the second primary light beam having internal orbital angular momentum, wherein the first primary light beam is characterized by an azimuthal mode index that differs from an azimuthal mode index of the second primary light beam such that the interference of the first primary light beam and the second primary light beam creates a ring-shaped interference pattern of alternating dark and bright intensities to generate the plurality of lattice sites; and
a pair of secondary laser light sources generates the second set of light beams comprising a first secondary light beam and a second secondary light beam, each of the first secondary light beam and the second secondary light beam having internal orbital angular momentum, wherein the first secondary light beam is characterized by an azimuthal mode index that differs from an azimuthal mode index of the second secondary light beam such that the interference of the first secondary light beam and the second secondary light beam creates a ring-shaped interference pattern of alternating dark and bright intensities, wherein the azimuthal mode indices of the second set of light beams differs from the azimuthal mode indices of the first set of light beams so that the ring-shaped interference pattern formed by the second set of light beams occurs at a periodicity that differs from a periodicity of the ring-shaped interference pattern formed by the first set of light beams;
wherein the modulation mechanism is configured to cause the ring-shaped interference pattern formed by the second set of light beams to overlap with the ring-shaped interference pattern formed by the first set of light beams to generate the modulated ring-shaped interference pattern;

wherein the medium is confined within the modulated ring-shaped interference pattern;

wherein the modulation mechanism includes an apparatus for adjusting power of each of the primary laser light sources and the secondary laser light sources to tune the coupling strength and the modulation amplitude.

7. The sensor system recited in claim 5, further comprising an additional light source configured to generate a light-sheet to further confine the medium.

8. The sensor system recited in claim 5, further comprising an apparatus for generating the atoms or molecules as the medium, the apparatus configured to place the atoms or the molecules in an ultracold state to generate ultracold atoms or molecules as the medium, wherein the atoms or the molecules display quantum mechanical features of coherent matter waves.

9. The sensor system recited in claim 5, further comprising an apparatus for adjusting the azimuthal mode indices and the internal orbital angular momenta of the first set of light beams and the second set of light beams to adjust and control the lattice period and the modulation period.

10. The sensor system recited in claim 1, wherein the artificial lattice comprises:
a substrate having a first material and a plurality of second material formations within the first material, the first material having an energy bandgap that is wider than an energy bandgap of the second material, the second material formations being configured to confine the medium;
wherein the plurality of second material formations is arranged in the closed ring-shape; and
wherein the substrate is configured as a transistor having a source terminal, a drain terminal, and a gate terminal; and
wherein the modulation mechanism includes an apparatus for adjusting voltage applied to the transistor.

11. The sensor system recited in claim 10, wherein the modulation mechanism is configured to vary the energy bandgaps of the plurality of the second material formations.

12. The sensor system recited in claim 10, wherein the modulation mechanism is configured to vary the physical dimension of the plurality of the second material formations.

13. The sensor system recited in claim 1, further comprising a detection unit configured to receive the output.

14. The sensor system recited in claim 1, wherein the medium is any one or combination of:
photons;
ultracold atoms or molecules; and
particles that carry electric charge.

15. The sensor system recited in claim 1, wherein the medium interacts with itself and the effects of such interaction is utilized to attain better sensitivity.

16. A method for sensing rotation, the method comprising the steps of:
adjusting a modulation mechanism of a sensor system, the sensor system comprising:
an artificial lattice structure configured to confine a medium to a plurality of lattice sites arranged in the shape of a closed ring, the artificial lattice structure having a lattice period that defines a distance between adjacent lattice sites, wherein each lattice site is defined as a potential well having a site depth; and
the modulation mechanism configured for varying the site depth of any one or combination of lattice sites of the plurality of lattice sites, in accordance with a modulation period, the modulation period being different from the lattice period, and a magnitude of the modulation defined by a modulation amplitude; and
wherein the medium comprises a property of being able to migrate among the plurality of lattice sites, with a propensity of migration defined by a coupling strength between adjacent lattice sites; and
wherein the sensor system is configured to generate an output that is a function of the distribution of the medium in the artificial lattice structure;
the adjustment generates a ratio of the coupling strength to the modulation amplitude that causes the medium to have a tendency to delocalize or have a tendency to localize;
wherein the degree of localization is sensitive to presence of rotation, intrinsic or extrinsic, and to magnitude and/or rate of the rotation and/or to orientation of the rotation; and
wherein, when the medium is a charged medium, the degree of localization is sensitive to presence of a magnetic field and to magnitude and/or orientation of that magnetic field;
introducing the medium so as to be distributed among the plurality of lattice sites according to a predetermined distribution function;
allowing the medium to exist or evolve in the sensor system for a predetermined period of time;
measuring distribution of the medium among the plurality of lattice sites and quantifying the degree of localization of the medium;
detecting rotation by determining a magnitude of angular velocity via a calibration of degree of localization to the magnitude of rotation and/or rate of rotation.

17. The method for sensing rotation recited in claim 16, wherein:
detecting rotation comprises measuring extrinsic rotation;
the modulation mechanism is adjusted so that the ratio of the coupling strength to the modulation amplitude causes the medium to have a tendency to delocalize in the absence of any rotation; and
the presence of rotation causes partial localization in proportion to a rate of rotation.

18. The method for sensing rotation recited in claim 16, wherein detecting rotation comprises detecting relative rotation of a first component and a second component, wherein:
the first component comprises the artificial lattice structure and a first object attached thereto;
the second component comprises the modulation mechanism and a second object attached thereto;
the modulation mechanism is adjusted so that the ratio of the coupling strength to the modulation amplitude causes the medium to have a tendency to localize in the absence of any rotation; and
the presence of rotation causes partial delocalization in proportion to a rotation.

19. A method for sensing magnetic fields and/or magnetic potentials, the method comprising of the steps of:
adjusting a modulation mechanism of a sensor system, the sensor system comprising:
an artificial lattice structure configured to confine a medium to a plurality of lattice sites arranged in the shape of a closed ring, the artificial lattice structure having a lattice period that defines a distance between adjacent lattice sites, wherein each lattice site is defined as a potential well having a site depth; and
the modulation mechanism configured for varying the site depth of any one or combination of lattice sites of the plurality of lattice sites, in accordance with a modulation period, the modulation period being different from the lattice period, and a magnitude of the modulation defined by a modulation amplitude; and wherein the medium comprises a property of being able to migrate among the plurality of lattice sites, with a propensity of migration defined by a coupling strength between adjacent lattice sites; and wherein the sensor system is configured to generate an output that is a function of the distribution of the medium in the artificial lattice structure;

the adjustment generates a ratio of the coupling strength to the modulation amplitude that causes the medium to have a tendency to delocalize;

wherein the degree of localization is sensitive to presence of rotation, intrinsic or extrinsic, and to magnitude and/or rate of the rotation and/or to orientation of the rotation; and wherein, when the medium is a charged medium, the degree of localization is sensitive to presence of a magnetic field and to magnitude and/or orientation of that magnetic field;

introducing the medium, the medium carrying electric charge, so as to be distributed among the plurality of lattice sites according to a predetermined distribution function;

allowing the medium to exist or evolve in the sensor system for a predetermined period of time;

measuring the distribution of the medium among the plurality of lattice sites and quantifying the degree of localization of the medium; and detecting presence of a magnetic field and/or a magnetic potential by calibration of the degree of localization to the magnitude of magnetic field and/or the magnitude of the magnetic potential.

20. The method of claim 16 or 19, wherein:

a direction of rotation, as in left handed or right handed, clockwise or anticlockwise, or an orientation of the magnetic field is determined by calibrating or preparing the system such that the degree of localization increases in the presence of rotation that is in a first direction but increases by a different amount or decreases when in the presence of rotation that is in a second direction, or the degree of localization increases in the presence of magnetic field or potential that is in a first orientation but increases by a different amount or decreases when in the presence of a magnetic field or potential that is in a second orientation.

21. The method for sensing magnetic field recited in claim 19, wherein:

the modulation mechanism is adjusted so that the ratio of the coupling strength to the modulation amplitude causes the medium to have a tendency to delocalize in the absence of any magnetic field; and the presence of a magnetic field causes partial localization in proportion to the strength of the magnetic field.

* * * * *